US012652856B2

(12) United States Patent (10) Patent No.: US 12,652,856 B2
No et al. (45) Date of Patent: Jun. 9, 2026

(54) DISPLAY PANEL AND ELECTRONIC DEVICE INCLUDING THE SAME

(71) Applicant: Samsung Display Co., Ltd., Yongin-si (KR)

(72) Inventors: Taehyoung No, Yongin-si (KR); Hyungjun Park, Yongin-si (KR); Junyong An, Yongin-si (KR); Nuree Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 589 days.

(21) Appl. No.: 18/319,324

(22) Filed: May 17, 2023

(65) Prior Publication Data

US 2023/0395770 A1 Dec. 7, 2023

(30) Foreign Application Priority Data

Jun. 7, 2022 (KR) ........................ 10-2022-0069106

(51) Int. Cl.
| | |
|---|---|
| *H10D 86/40* | (2025.01) |
| *H10K 59/131* | (2023.01) |
| *H10K 59/65* | (2023.01) |

(52) U.S. Cl.
CPC ......... *H10D 86/441* (2025.01); *H10K 59/131* (2023.02); *H10K 59/65* (2023.02)

(58) Field of Classification Search
CPC ..... H10D 86/441; H10K 59/131; H10K 59/65
See application file for complete search history.

(56) References Cited

U.S. PATENT DOCUMENTS

| | | |
|---|---|---|
| 2020/0098835 A1 | 3/2020 | Bae et al. |
| 2020/0144352 A1 | 5/2020 | Lee et al. |
| 2021/0143237 A1 | 5/2021 | Lee et al. |
| 2021/0151425 A1 | 5/2021 | Kim et al. |

(Continued)

FOREIGN PATENT DOCUMENTS

| | | |
|---|---|---|
| CN | 111916486 A | 11/2020 |
| KR | 10-2018-0049296 A | 5/2018 |

(Continued)

*Primary Examiner* — Peter M Albrecht
(74) *Attorney, Agent, or Firm* — Womble Bond Dickinson (US) LLP

(57) ABSTRACT

A display panel includes a plurality of first sub-pixel circuits in a first display area electrically connected to first light-emitting diodes in the first display area, and subpixel circuits in the third display area, wherein first sub-pixel circuits arranged in a $(k)^{th}$ row (k is a natural number) in a first direction are connected to a first gate line, first sub-pixel circuits arranged in a $(k+1)^{th}$ row are connected to a second gate line, and first sub-pixel circuits arranged in a $(k+2)^{th}$ row are connected to a third gate line, wherein the first and third gate lines are respectively and electrically connected to two sub-pixel circuits adjacent to each other in a second direction intersecting the first direction in the third display area, and the second gate line is not electrically connected to the sub-pixel circuits located in the third display area and bypasses the second display area.

20 Claims, 18 Drawing Sheets

(56)            References Cited

U.S. PATENT DOCUMENTS

| | | | |
|---|---|---|---|
| 2021/0193758 A1 | 6/2021 | Choi et al. | |
| 2021/0351261 A1 | 11/2021 | Kim et al. | |
| 2022/0069047 A1 | 3/2022 | Yang et al. | |
| 2022/0165216 A1 | 5/2022 | Hong et al. | |
| 2023/0026822 A1* | 1/2023 | Wang | H10D 86/441 |
| 2023/0260454 A1* | 8/2023 | Gu | H10K 59/131 |
| | | | 345/206 |

FOREIGN PATENT DOCUMENTS

| | | |
|---|---|---|
| KR | 2020-0034290 A | 3/2020 |
| KR | 10-2020-0051108 A | 5/2020 |
| KR | 10-2021-0055850 A | 5/2021 |
| KR | 10-2021-0081572 A | 7/2021 |
| KR | 10-2022-0070124 A | 5/2022 |

* cited by examiner

DISPLAY PANEL AND ELECTRONIC DEVICE INCLUDING THE SAME

CROSS-REFERENCE TO RELATED APPLICATION

The present application claims priority to and the benefit of Korean Patent Application No. 10-2022-0069106, filed on Jun. 7, 2022, in the Korean Intellectual Property Office, the entire disclosure of which is incorporated herein by reference.

BACKGROUND

1. Field

Aspects of one or more embodiments relate to a display panel and a structure of an electronic device including the display panel.

2. Description of the Related Art

A display panel is a device for visually displaying data. Recently, the various uses or applications of display panels has been diversified. As thicknesses and weights of display panels have decreased, the range of potential applications of display panels has increased.

In order to increase an area occupied by a display area and add various functions, research has been conducted into a display panel having an area for adding various functions other than image display to the display area.

The above information disclosed in this Background section is only for enhancement of understanding of the background and therefore the information discussed in this Background section does not necessarily constitute prior art.

SUMMARY

Aspects of one or more embodiments include a display panel including a transmissive area in a display area, and a structure of an electronic device including the display panel.

Additional aspects will be set forth in part in the description which follows and, in part, will be apparent from the description, or may be learned by practice of the presented embodiments.

According to one or more embodiments, a display panel includes a plurality of light-emitting diodes located in a first display area, a second display area, and a third display area, wherein the second display area is inside the first display area and includes a transmissive area, and the third display area is between the first display area and the second display area, a plurality of first sub-pixel circuits located in the first display area, and respectively and electrically connected to first light-emitting diodes located in the first display area from among the plurality of light-emitting diodes, and sub-pixel circuits located in the third display area, wherein the sub-pixel circuits include: a plurality of second sub-pixel circuits electrically connected to a plurality of second light-emitting diodes located in the second display area from among the plurality of light-emitting diodes; and a plurality of third sub-pixel circuits electrically connected to a plurality of third light-emitting diodes located in the third display area from among the plurality of light-emitting diodes, wherein first sub-pixel circuits arranged in a $(k)^{th}$ row (k is a natural number) in a first direction are electrically connected to a first gate line, first sub-pixel circuits arranged in a $(k+1)^{th}$ row in the first direction are electrically connected to a second gate line, and first sub-pixel circuits arranged in a $(k+2)^{th}$ row in the first direction are electrically connected to a third gate line, wherein the first gate line and the third gate line are respectively and electrically connected to two sub-pixel circuits adjacent to each other in a second direction intersecting the first direction in the third display area, and the second gate line is not electrically connected to the sub-pixel circuits located in the third display area, and bypasses the second display area in an outside of the second display area.

According to one or more embodiments, an electronic device includes a display panel including a plurality of light-emitting diodes arranged in a display area, and a component located under the display panel. According to some embodiments, the component may include a sensor or a camera.

According to some embodiments, the two sub-pixel circuits adjacent to each other in the second direction in the third display area may be spaced apart from each other with a gap therebetween, wherein a bypassing portion of the second gate line passes through a portion corresponding to the gap in the third display area.

According to some embodiments, the second gate line may include a first portion overlapping the first sub-pixel circuits arranged in the $(k+1)^{th}$ row and a bypassing portion bypassing the second display area in the outside of the second display area, wherein the first portion and the bypassing portion of the second gate line are connected to each other through a contact hole defined by at least one insulating layer located between the bypassing portion and the first portion.

According to some embodiments, the bypassing portion of the second gate line may overlap any one of the two sub-pixel circuits adjacent to each other in the second direction in the third display area.

According to some embodiments, the bypassing portion of the second gate line may overlap a first sub-pixel circuit arranged in a different row in the first display area.

According to some embodiments, the display panel may further include a data line electrically connected to at least one first sub-pixel circuit from among the plurality of first sub-pixel circuits, wherein the data line is electrically connected to the two sub-pixel circuits adjacent to each other in the second direction in the third display area, and is bent to partially surround the second display area.

According to some embodiments, each of the plurality of second sub-pixel circuits may be electrically connected to two second light-emitting diodes emitting light of a same color.

According to some embodiments, each of the plurality of third sub-pixel circuits may be electrically connected to two third light-emitting diodes emitting light of a same color.

According to some embodiments, each of the plurality of first sub-pixel circuits may be electrically connected to one first light-emitting diode.

According to some embodiments, the first display area, the second display area, and the third display area may correspond to an image surface of the display panel, wherein a center of the second display area is spaced apart from a virtual line passing through a center of the image surface in the second direction in a plan view.

BRIEF DESCRIPTION OF THE DRAWINGS

The above and other aspects, features, and advantages of certain embodiments will be more apparent from the following description taken in conjunction with the accompanying drawings, in which:

FIG. 2 is a cross-sectional view schematically illustrating an electronic device, according to some embodiments;

FIGS. 10A and 10B are cross-sectional views illustrating that a second light-emitting diode and a second sub-pixel circuit of a display panel are electrically connected through a connection line, according to some embodiments;

DETAILED DESCRIPTION

Figure 1:
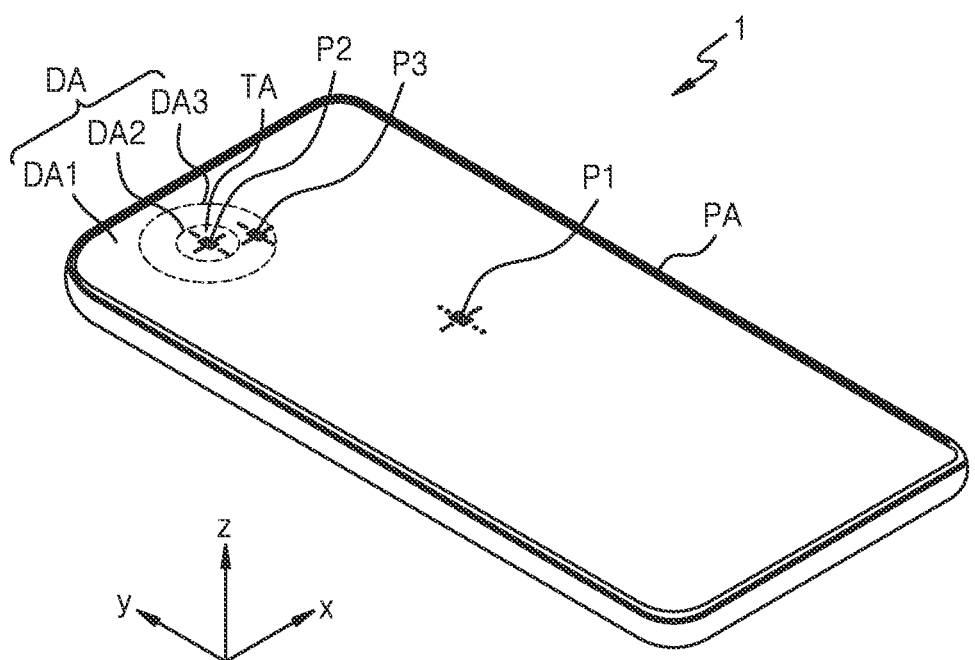
FIG. 1 is a perspective view schematically illustrating an electronic device, according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description.

Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "including" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating an electronic device, according to some embodiments.

Referring to FIG. 1, an electronic device 1 may include a display area DA and a peripheral area PA located outside the display area DA. The display area DA may display an image through sub-pixels. The peripheral area PA is located outside the display area DA and is a non-display area where an image is not displayed. The peripheral area PA may entirely surround the display area DA. A driver or the like for applying an electrical signal or power to the display area DA may be located in the peripheral area PA. A pad to which an electronic device, a printed circuit board, or the like may be electrically connected may be located in the peripheral area PA.

Although the electronic device 1 is a smartphone for convenience of explanation, the electronic device 1 of the disclosure is not limited thereto. The electronic device 1 may be applied to any of various products such as a television, a laptop computer, a monitor, an advertisement board, or an Internet of things (IoT) product as well as a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC). Also, the electronic device 1 according to some embodiments may be applied to a wearable device such as a smart watch, a watch phone, a glasses-type display, or a head-mounted display (HMD). Also, the electronic device 1 according to some embodiments may be applied to a center information display (CID) located on an instrument panel, a center fascia, or a dashboard of a vehicle, a room mirror display replacing a side-view mirror of a vehicle, or a display screen located on the back of a front seat for entertainment for a back seat of a vehicle.

The display area DA may include a first display area DA1, a second display area DA2, and a third display area DA3. The display area DA may display images by using sub-pixels that are two dimensionally arranged (e.g., arranged in a matrix configuration of rows and columns). The sub-pixels may include first sub-pixels P1 arranged in the first display area DA1, second sub-pixels P2 arranged in the second display area DA2, and third sub-pixels P3 arranged in the third display area DA3.

The first display area DA1 may occupy most of the area of the display area DA. When the first display area DA1 occupies most of the area of the display area DA, it may mean that the area of the first display area DA1 is 50% or more of the area of the display area DA. The second display area DA2 may be located inside the display area DA. For example, the second display area DA2 may be entirely surrounded by the first display area DA1. The third display area DA3 may be located between the first display area DA1 and the second display area DA2. The third display area DA3 may entirely surround the second display area DA2, and be entirely surrounded by the first display area DA1.

Each of the second display area DA2 and the third display area DA3 may have a smaller area than that of the first display area DA1. According to some embodiments, although it is shown in FIG. 1 that each of the second display area DA2 and the third display area DA3 has a circular shape, according to some embodiments, each of the second display area DA2 and the third display area DA3 may have a polygonal shape such as a substantially quadrangular shape.

Although it is shown in FIG. 1 that the second display area DA2 and the third display area DA3 are located on the left of an upper side (+y direction) of the display area DA having a substantially quadrangular shape when viewed in a direction substantially perpendicular to a top surface of the electronic device 1, the disclosure is not limited thereto. The second display area DA2 and the third display area DA3 may be located, for example, on an upper right side or upper center side of the display area DA.

The second display area DA2 may be configured to display an image by using the second sub-pixels P2, and transmit light or sound through a portion between the second sub-pixels P2. Hereinafter, the portion through which light or sound may be transmitted is referred to as a transmissive area TA. In other words, the second display area DA2 may include the transmissive area TA between the second sub-pixels P2.

Figure 2:
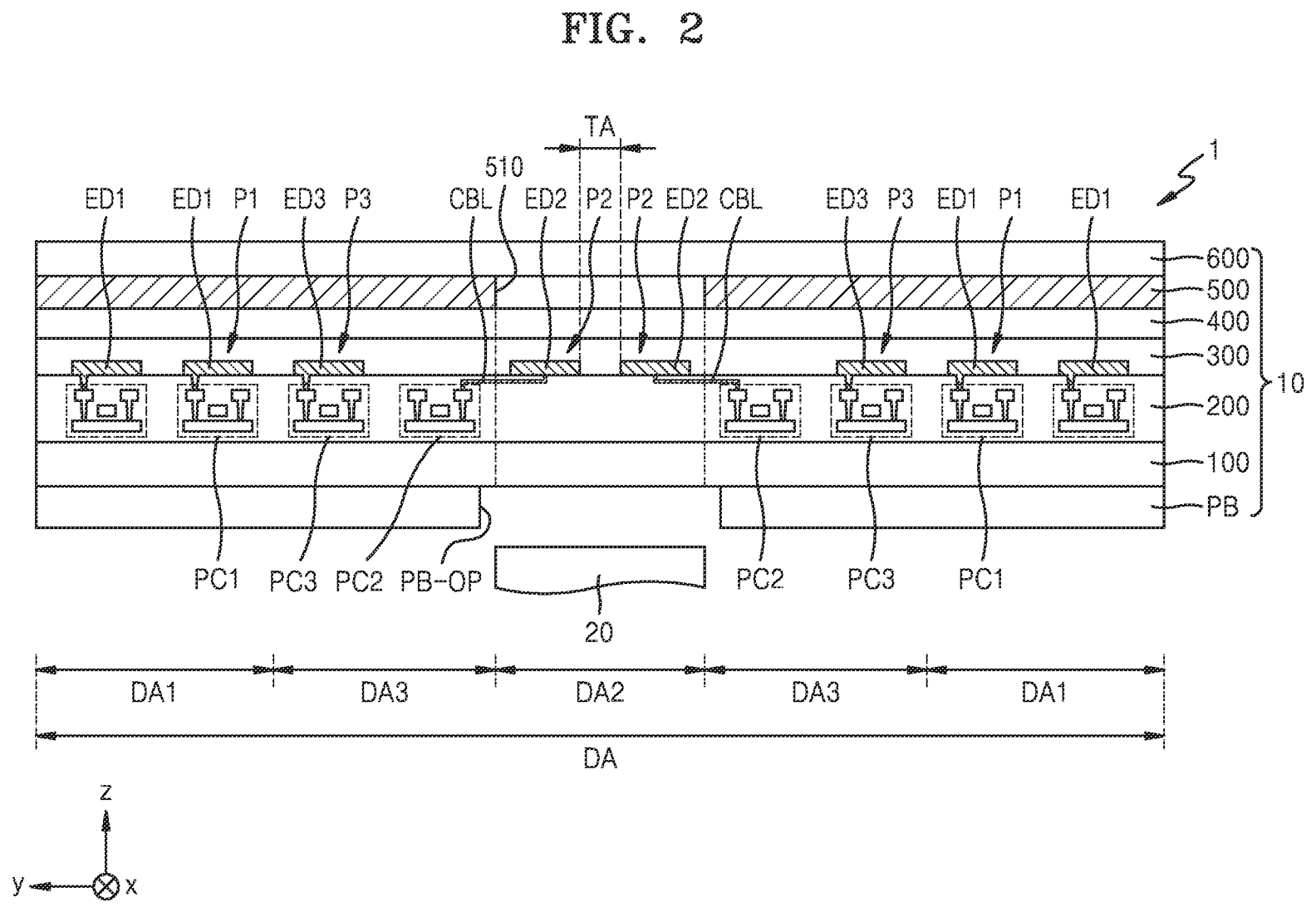

FIG. 2 is a cross-sectional view schematically illustrating an electronic device, according to some embodiments.

Referring to FIG. 2, the electronic device 1 may include a display panel 10 and a component 20 overlapping the display panel 10. The component 20 may be located in the second display area DA2.

The component 20 may be an electronic element using light or sound. For example, the electronic element may be a sensor that measures a distance such as a proximity sensor, a sensor that recognizes a user's body part (e.g., a fingerprint, the iris, or the face), a small lamp that outputs light, or an image sensor (e.g., a camera) that captures an image. The electronic element using light may use light of any of various wavelength bands such as visible light, infrared light, or ultraviolet light. The electronic element using sound may use ultrasound or sound of another frequency band.

The second display area DA2 may include the transmissive area TA through which light and/or sound output from the component 20 to the outside or traveling toward the component 20 from the outside may be transmitted. According to some embodiments, the transmissive area TA through which light may be transmitted may correspond to a portion between the second sub-pixels P2. In the electronic device 1 according to some embodiments, when light is transmitted through the second display area DA2 including the transmissive area TA, a light transmittance may be equal to or greater than about 10%, and more preferably, equal to or greater than about 25%, about 40%, about 50%, about 85%, or about 90%.

Each of the first sub-pixel P1, the second sub-pixel P2, and the third sub-pixel P3 described with reference to FIG. 1 may emit light by using a light-emitting diode, and each light-emitting diode may be located in the display area DA of the display panel 10. In this regard, in the present specification, a light-emitting diode corresponding to the first sub-pixel P1 in the first display area DA1 is referred to as a first light-emitting diode ED1, a light-emitting diode corresponding to the second sub-pixel P2 in the second display area DA2 is referred to as a second light-emitting diode ED2, and a light-emitting diode corresponding to the third sub-pixel P3 in the third display area DA3 is referred to as a third light-emitting diode ED3. The first through third light-emitting diodes ED1, ED2, and ED3 may be arranged over a substrate 100.

The substrate 100 may include an insulating material such as a polymer resin or a glass material. A protective film PB may be located on a rear surface of the substrate 100. The substrate 100 may be a rigid substrate, or a flexible substrate that is bendable, foldable, or rollable. The protective film PB may include an opening PB-OP located in the second display area DA2 to increase a transmittance of the transmissive area TA.

The first light-emitting diode ED1 is located in the first display area DA1 and is electrically connected to a first sub-pixel circuit PC1 located in the first display area DA1. The first sub-pixel circuit PC1 may include transistors and a storage capacitor electrically connected to the transistors.

The second light-emitting diode ED2 is located in the second display area DA2. The second light-emitting diode ED2 is electrically connected to a second sub-pixel circuit PC2. The second sub-pixel circuit PC2 is not located in the second display area DA2 to increase a transmittance and a transmissive area of the transmissive area TA in the second display area DA2. The second sub-pixel circuit PC2 may be located in the third display area DA3, and the second light-emitting diode ED2 may be electrically connected to the second sub-pixel circuit PC2 through a conductive bus line CBL.

The conductive bus line CBL may electrically connect the second sub-pixel circuit PC2 in the third display area DA3 to the second light-emitting diode ED2 in the second display area DA2. The conductive bus line CBL may include a light transmissive conductive material, for example, a transparent conductive oxide (TCO).

The third light-emitting diode ED3 is located in the third display area DA3, and is electrically connected to a third sub-pixel circuit PC3 located in the third display area DA3. The third sub-pixel circuit PC3 may include transistors and a storage capacitor electrically connected to the transistors.

The first through third light-emitting diodes ED1, ED2, and ED3 are respectively light-emitting elements that emit light of certain colors, and may include organic light-emitting diodes. According to some embodiments, the first through third light-emitting diodes ED1, ED2, and ED3 may include inorganic light-emitting diodes, or light-emitting diodes including quantum dots.

The first through third light-emitting diodes ED1, ED2, and ED3 may be covered by an encapsulation layer 300. The encapsulation layer 300 may be a thin-film encapsulation layer including an inorganic encapsulation layer and an organic encapsulation layer, wherein the inorganic encapsulation layer includes an inorganic insulating material, and the organic encapsulation layer includes an organic insulating material. According to some embodiments, the encapsulation layer 300 may include a first inorganic encapsulation layer, a second inorganic encapsulation layer, and an organic encapsulation layer between the first and second inorganic encapsulation layers.

According to some embodiments, the encapsulation layer 300 may be an encapsulation substrate such as a glass material. A sealant such as frit may be located between the substrate 100 and the capsulation substrate. The sealant may be located in the peripheral area PA and may extend to surround an outer edge of the display area DA to prevent or reduce instances of moisture or other contaminants penetrating toward the first through third light-emitting diodes ED1, ED2, and ED3 through a side surface.

An input sensing layer 400 may be formed on the encapsulation layer 300. The input sensing layer 400 may obtain coordinate information corresponding to an external input, for example, a touch event of a finger or an object such as a stylus pen. The input sensing layer 400 may include a touch electrode and trace lines connected to the touch electrode. The input sensing layer 400 may detect an external input by using a mutual capacitance method or a self-capacitance method.

An optical functional layer 500 may include an anti-reflection layer. The anti-reflection layer may reduce a reflectance of light (external light) incident on the display panel 10 through a cover window 600. The anti-reflection layer may include a phase retarder and a polarizer. When the optical functional layer 500 includes a polarizer, the optical functional layer 500 may include an opening 510 located in the second display area DA2, to increase a transmittance of the transmissive area TA.

According to some embodiments, the anti-reflection layer may include a black matrix and color filters. The color filters may be arranged by considering colors of light respectively emitted from the first through third light-emitting diodes ED1, ED2, and ED3. When the optical functional layer 500 includes the black matrix and the color filters, a light transmissive material may be arranged at a position corresponding to the transmissive area TA.

According to some embodiments, the anti-reflection layer may include a destructive interference structure. The destructive interference structure may include a first reflective layer and a second reflective layer that are located on different layers. First reflected light and second reflected light respectively reflected by the first reflective layer and the second reflective layer may destructively interfere with each other, thereby reducing a reflectance of external light.

The cover window 600 may be located on the optical functional layer 500. The cover window 600 may be coupled to the optical functional layer 500 by an adhesive layer such as an optically clear adhesive located between the cover window 600 and the optical functional layer 500. The cover window 600 may include a glass material or a plastic material. Examples of the plastic material may include polyethersulfone, polyacrylate, polyetherimide, polyethylene naphthalate, polyethylene terephthalate, polyphenylene sulfide, polyarylate, polyimide, polycarbonate, and cellulose acetate propionate.

The cover window 600 may include a flexible cover window. For example, the cover window 600 may include a polyimide cover window or an ultra-thin glass cover window.

Figure 3:
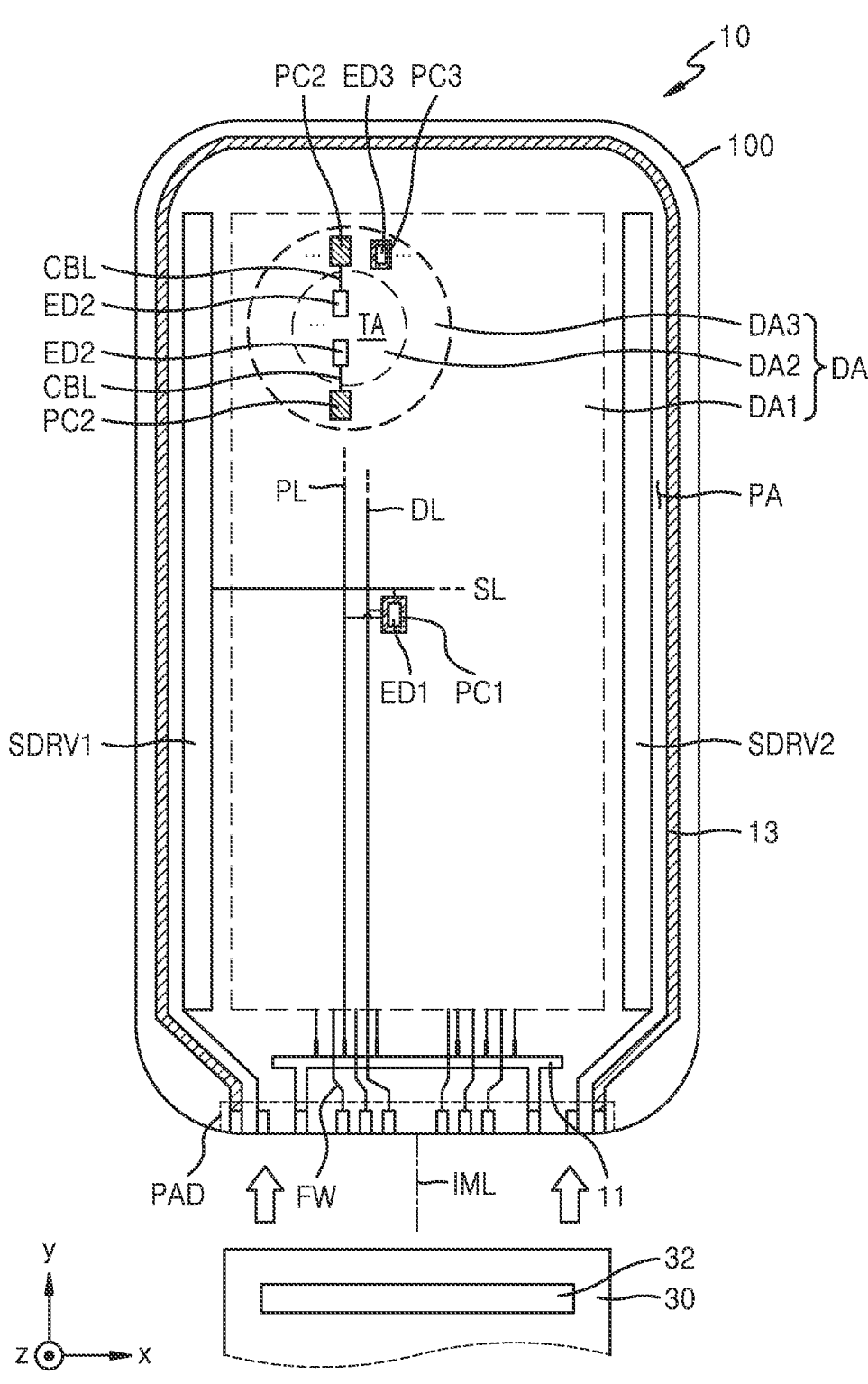
FIG. 3 is a plan view schematically illustrating a display panel, according to some embodiments.

FIG. 3 is a plan view schematically illustrating a display panel, according to some embodiments.

Referring to FIG. 3, the display panel 10 may include the display area DA and the peripheral area PA. The display area DA may include the first through third display areas DA1, DA2, and DA3. The display area DA, for example, the first through third display areas DA1, DA2, and DA3, may correspond to an image surface of the display panel 10. The second and third display areas DA2 and DA3 may be spaced apart from a virtual line IML passing through the center of the display area DA and/or the center of the image surface. For example, the center of the second display area DA2 and the center of the third display area DA3 may be spaced apart from the virtual line IML passing through the center of the display area DA and/or the center of the image surface as shown in FIG. 3.

Light-emitting diodes are arranged in the first through third display areas DA1, DA2, and DA3. Sub-pixel circuits respectively and electrically connected to the light-emitting diodes are located in the first and third display areas DA1 and DA3, but are not located in the second display area DA2. For example, the first sub-pixel circuits PC1 electrically connected to the first light-emitting diodes ED1 located in the first display area DA1 may be located in the first display area DA1. The second and third sub-pixel circuits PC2 and PC3 electrically connected to the second and third light-emitting diodes ED2 and ED3 located in the second and third display areas DA2 and DA3 may be located in the third display area DA3. In other words, some (e.g., the second sub-pixel circuits PC2) of the sub-pixel circuits located in the third display area DA3 may be electrically connected to the second light-emitting diodes ED2 located in the second display area DA2, and others (e.g., the third sub-pixel circuits PC3) of the sub-pixel circuits located in the third display area DA3 may be electrically connected to the third light-emitting diodes ED3 located in the third display area DA3.

The first light-emitting diode ED1 is located in the first display area DA1. Light emitted from the first light-emitting diode ED1 may correspond to light from the first sub-pixel P1 (see FIG. 1) described with reference to FIG. 1, and a position of the first light-emitting diode ED1 may be a position of the first sub-pixel P1 (see FIG. 1). The first light-emitting diode ED1 may emit, for example, red, green, or blue light. The first sub-pixel circuit PC1 that drives the first light-emitting diode ED1 is located in the first display area DA1, and may be electrically connected to the first light-emitting diode ED1.

The first sub-pixel circuit PC1 is electrically connected to a scan line SL and a data line DL, wherein the scan line SL extends in a first direction (e.g., an x direction), and the data line DL extends in a second direction (e.g., a y direction). A first driving circuit SDRV1 and a second driving circuit SDRV2 configured to apply signals to each first sub-pixel circuit PC1, may be located in the peripheral area PA.

The first driving circuit SDRV1 may apply a scan signal to each first sub-pixel circuit PC1 through the scan line SL. The second driving circuit SDRV2 may be located opposite to the first driving circuit SDRV1 with the first display area DA1 therebetween. Some of the first sub-pixel circuits PC1 in the first display area DA1 may be electrically connected to the first driving circuit SDRV1, and the rest may be electrically connected to the second driving circuit SDRV2.

The pad PAD may be located on a side portion of the substrate 100. The pad PAD may be exposed without being covered by an insulating layer, and may be connected to a circuit board 30. A control driver 32 may be located on the circuit board 30.

The control driver 32 may generate control signals transmitted to the first driving circuit SDRV1 and the second driving circuit SDRV2. The control driver 32 may include a data driving circuit. The data driving circuit may generate a data signal. The generated data signal may be transmitted to the first sub-pixel circuits PC1 through a fan-out wiring FW and the data line DL, wherein the fan-out wiring FW is located in the peripheral area PA of the display panel 10 and the data line DL is connected to the fan-out wiring FW. According to some embodiments, the data driving circuit may be located in the peripheral area PA of the substrate 100.

The second light-emitting diode ED2 is located in the second display area DA2. Light emitted from the second light-emitting diode ED2 may correspond to light from the second sub-pixel P2 (see FIG. 1) described with reference to FIG. 1, and a position of the second light-emitting diode ED2 may be a position of the second sub-pixel P2 (see FIG. 1). The second light-emitting diode ED2 may be configured to emit, for example, red, green, or blue light.

The transmissive area TA may be located between the second light-emitting diodes ED2. According to some embodiments, a portion of the second display area DA2 in which the second light-emitting diodes ED2 are not arranged, may correspond to the transmissive area TA. To increase the area of the transmissive area TA and increase a transmittance of the transmissive area TA, the second sub-pixel circuit PC2 configured to drive the second light-emitting diode ED2 may be located in the third display area DA3 outside the second display area DA2. Some of the second sub-pixel circuits PC2 may be located in a portion of the third display area DA3 adjacent to an upper side of the second display area DA2, and others of the second sub-pixel circuits PC2 may be located in a portion of the third display area DA3 adjacent to a lower side of the second display area DA2.

The second sub-pixel circuit PC2 in the third display area DA3 may be electrically connected to the second light-emitting diode ED2 in the second display area DA2 by the conductive bus line CBL. The second light-emitting diode ED2 may be electrically connected to the second sub-pixel circuit PC2 through the conductive bus line CBL extending in the second direction (e.g., y direction).

The third light-emitting diode ED3 is located in the third display area DA3. Light emitted from the third light-emitting diode ED3 may correspond to light of the third sub-pixel P3 (see FIG. 1) described with reference to FIG. 1, and a position of the third light-emitting diode ED3 may be a position of the third sub-pixel P3 (see FIG. 1). The third light-emitting diode ED3 may emit, for example, red, green, or blue light.

The third sub-pixel circuit PC3 configured to drive the third light-emitting diode ED3 is located in the third display area DA3. The third sub-pixel circuit PC3 is electrically connected to the third light-emitting diode ED3, to operate the third light-emitting diode ED3.

The second sub-pixel circuit PC2 and the third sub-pixel circuit PC3 may be electrically connected to the first driving circuit SDRV1 and/or the second driving circuit SDRV2. At least one second sub-pixel circuit PC2 and/or at least one third sub-pixel circuit PC3 may share the scan line with at least one first sub-pixel circuit PC1. At least one second sub-pixel circuit PC2 and/or at least one third sub-pixel circuit PC3 may share the data line with at least one first sub-pixel circuit PC1.

A driving voltage supply line 11 and a common voltage supply line 13 may be located in the peripheral area PA. The driving voltage supply line 11 may supply a driving voltage to a sub-pixel circuit, for example, each of the first through third sub-pixel circuits PC1, PC2, and PC3. The common voltage supply line 13 may apply a common voltage to a second electrode (cathode) of the light-emitting diode, for example, the first through third light-emitting diodes ED1, ED2, and ED3.

The driving voltage supply line 11 may be located between the pad PAD and a side of the display area DA. The common voltage supply line 13 may have a loop shape having one open side and partially surround the display area DA in a plan view. The driving voltage supply line 11 may be electrically connected to a driving voltage line PL passing through the display area DA.

The first through third light-emitting diodes ED1, ED2, and ED3, the first through third sub-pixel circuits PC1, PC2, and PC3, the pad PAD, the first and second driving circuits SDRV1 and SDRV2, the driving voltage supply line 11, and the common voltage supply line 13 are located on the substrate 100. A shape of the display panel 10 shown in FIG. 3 may be substantially the same as a shape of the substrate 100. Accordingly, when the display panel 10 includes the display area DA and the peripheral area PA, it may mean that the substrate 100 includes the display area DA and the peripheral area PA.

Figure 4:
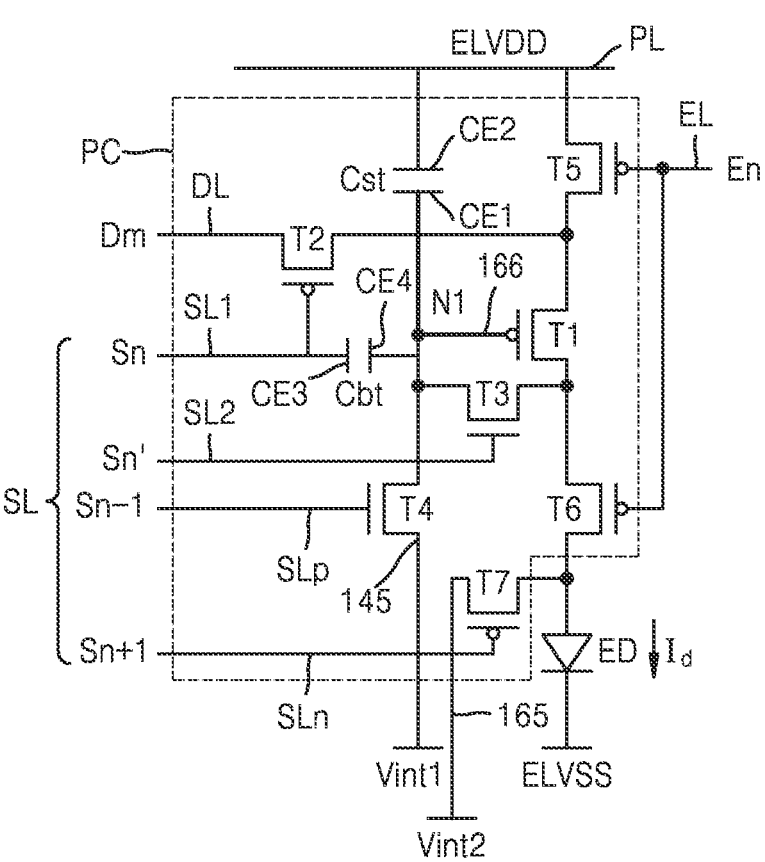
FIG. 4 is an equivalent circuit diagram schematically illustrating a sub-pixel circuit electrically connected to a light-emitting diode of a display panel, according to some embodiments.

FIG. 4 is an equivalent circuit diagram schematically illustrating a sub-pixel circuit electrically connected to a light-emitting diode of a display panel, according to some embodiments. A light-emitting diode ED of FIG. 4 may correspond to any of the first through third light-emitting diodes ED1, ED2, and ED3 described with reference to FIG. 3. A sub-pixel circuit PC of FIG. 4 may correspond to any of the first through third sub-pixel circuits PC1, PC2, and PC3 described with reference to FIG. 3. In other words, an equivalent circuit diagram of the first light-emitting diode ED1 (see FIG. 3) and the first sub-pixel circuit PC1, an equivalent circuit diagram of the second light-emitting diode ED2 (see FIG. 3) and the second sub-pixel circuit PC2, and an equivalent circuit diagram of the third light-emitting diode ED3 (see FIG. 3) and the third sub-pixel circuit PC3 may be the same. As described above, the light-emitting diode ED may include an organic light-emitting diode, an inorganic light-emitting diode, or a quantum-dot light-emitting diode.

The light-emitting diode ED may be electrically connected to the sub-pixel circuit PC. Referring to FIG. 4, the sub-pixel circuit PC may include first through seventh transistors T1, T2, T3, T4, T5, T6, and T7, a storage capacitor Cst, and a boost capacitor Cbt. In some embodiments, the sub-pixel circuit PC may not include the boost capacitor Cst. Hereinafter, for convenience of explanation, the following will be described assuming that the sub-pixel circuit PC includes the boost capacitor Cbt.

Some of the transistors T1, T2, T3, T4, T5, T6, and T7 may be n-channel metal oxide semiconductor (NMOS) field-effect transistors (n-channel MOSFET), and the rest may be p-channel metal oxide semiconductor (PMOS) field-effect transistors (p-channel MOSFET). For example, as shown in FIG. 4, the third and fourth transistors T3 and T4 may be n-channel MOSFETs, and the rest may be p-channel MOSFETs. According to some embodiments, the third, fourth, and seventh transistors T3, T4, and T7 may be n-channel MOSFETs, and the rest may be p-channel MOSFETs. Alternatively, only one of the first through seventh transistors T1, T2, T3, T4, T5, T6, and T7 may be an n-channel MOSFET, and the rest may be p-channel MOSFETs.

The first through seventh transistors T1, T2, T3, T4, T5, T6, and T7, the storage capacitor Cst, and the boost capacitor Cbt may be connected to signal lines. The signal lines may include the scan line SL, an emission control line EL, and the data line DL. The scan line SL may include a first scan line SL1 configured to transmit a first scan signal Sn, a second scan line SL2 configured to transmit a second scan signal Sn', a previous scan line SLp configured to transmit a previous scan signal Sn−1, and a next scan line SLn configured to transmit a next scan signal Sn+1.

The driving voltage line PL is configured to transmit a driving voltage ELVDD to the first transistor T1, and first and second initialization voltage lines 145 and 165 may be configured to respectively transmit first and second initialization voltages Vint1 and Vint2.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the light-emitting diode ED through the sixth transistor T6. One of the first electrode and the second electrode of the first transistor T1 may be a source electrode, and the other may be a drain electrode. The first transistor T1 may be configured to supply a driving current $I_d$ to the light-emitting diode ED according to a switching operation of the second transistor T2.

The second transistor T2 may be a switching transistor. A second gate electrode of the second transistor T2 is connected to the first scan line SL1, a first electrode of the second transistor T2 is connected to the data line DL, and a second electrode of the second transistor T2 is connected to the first electrode of the first transistor T1 and is electrically connected to the driving voltage line PL through the fifth transistor T5. One of the first electrode and the second electrode of the second transistor T2 may be a source electrode, and the other may be a drain electrode. The second transistor T2 may be turned on according to the first scan signal Sn transmitted through the first scan line SL and may perform a switching operation of transmitting a data signal Dm to the first electrode of the first transistor T1, wherein the data signal Dm is transmitted through the data line DL.

The third transistor T3 may be a compensation transistor configured to compensate for a threshold voltage of the first transistor T1. A third gate electrode of the third transistor T3 is connected to the second scan line SL2. A first electrode of the third transistor T3 is connected to the first gate electrode of the first transistor T1 and a lower electrode CE1 of the storage capacitor Cst through a node connection line 166. The first electrode of the third transistor T3 may be connected to the fourth transistor T4. A second electrode of the third transistor T3 is connected to the second electrode of the first transistor T1 and is electrically connected to the first electrode (e.g., the anode) of the light-emitting diode ED through the sixth transistor T6. One of the first electrode and the second electrode of the third transistor T3 may be a source electrode, and the other may be a drain electrode.

The third transistor T3 may be turned on according to the second scan signal Sn transmitted through the second scan line SL2, and may diode-connect the first transistor T1 by electrically connecting the first gate electrode to the second electrode of the first transistor T1.

The fourth transistor T4 may be a first initialization transistor configured to initialize the first gate electrode of the first transistor T1. A fourth gate electrode of the fourth transistor T4 is connected to the previous scan line SLp. A first electrode of the fourth transistor T4 is connected to the first initialization voltage line 145. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to the previous scan signal Sn−1 received through the previous scan line SLp and may perform an initialization operation of initializing a voltage of the first gate electrode of the first transistor T1 by transmitting the first initialization voltage Vint1 to the first gate electrode of the driving transistor T1.

The fifth transistor T5 may be an operation control transistor. A fifth gate electrode of the fifth transistor T5 is connected to the emission control line EL, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EL, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the light-emitting diode ED. One of the first electrode and the second electrode of the sixth transistor T6 may be a source electrode, and the other may be a drain electrode.

The fifth transistor T5 and the sixth transistor T6 may be simultaneously turned on according to an emission control signal En transmitted through the emission control line EL, the driving voltage ELVDD may be transmitted to the light-emitting diode ED, and the driving current $I_d$ may flow through the light-emitting diode ED.

The seventh transistor T7 may be a second initialization transistor configured to initialize the first electrode (e.g., the anode) of the light-emitting diode ED. A seventh gate electrode of the seventh transistor T7 is connected to the next scan line SLn. A first electrode of the seventh transistor T7 is connected to the second initialization voltage line 165. The second electrode of the seventh transistor T7 is connected to the second electrode of the sixth transistor T6 and the first electrode (e.g., the anode) of the light-emitting diode ED. The seventh transistor T7 may be turned on according to the next scan signal Sn+1 transmitted through the next scan line SLn and may initialize the first electrode of the light-emitting diode ED by transmitting the second initialization voltage Vint2 to the first electrode (e.g., the anode) of the light-emitting diode ED. Although it is shown in FIG. 4 that the seventh transistor T7 is connected to the next scan line SLn, the seventh transistor T7 may be connected to the previous scan line SLp.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may be configured to store charges corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the first scan line SL1, and the fourth electrode CE4 may be connected to the first electrode of the third transistor T3 and the node connection line 166. The boost capacitor Cbt may raise a voltage of a first node N1 when the first scan signal Sn supplied to the first scan line SL1 is turned off. When the voltage of the first node N1 is raised, a black grayscale may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to one another.

According to some embodiments, it is described with reference to FIG. 4 that the third and fourth transistors T3 and T4 are n-channel MOSFETs, and the first, second, fifth to seventh transistors T1, T2, T5, T6, and T7 are p-channel MOSFETs. The first transistor T1 directly affecting the brightness of a display apparatus may be configured to include a semiconductor layer including polycrystalline silicon having high reliability, and thus, a high-resolution display apparatus may be implemented through this configuration.

Although it is described with reference to FIG. 4 that the third and fourth transistors T3 and T4 are n-channel MOSFETs, according to some embodiments, the first through seventh transistors T1, T2, T3, T4, T5, T6, and T7 may be p-channel MOSFETs according to some embodiments. In this case, the second and third transistors T2 and T3 may be electrically connected to the same scan line. In some embodiments, the fourth and seventh transistors T4 and T7 may be electrically connected to the same scan line. In some embodiments, the fourth and seventh transistors T4 and T7 may be electrically connected to the same initialization voltage line.

Figure 5:
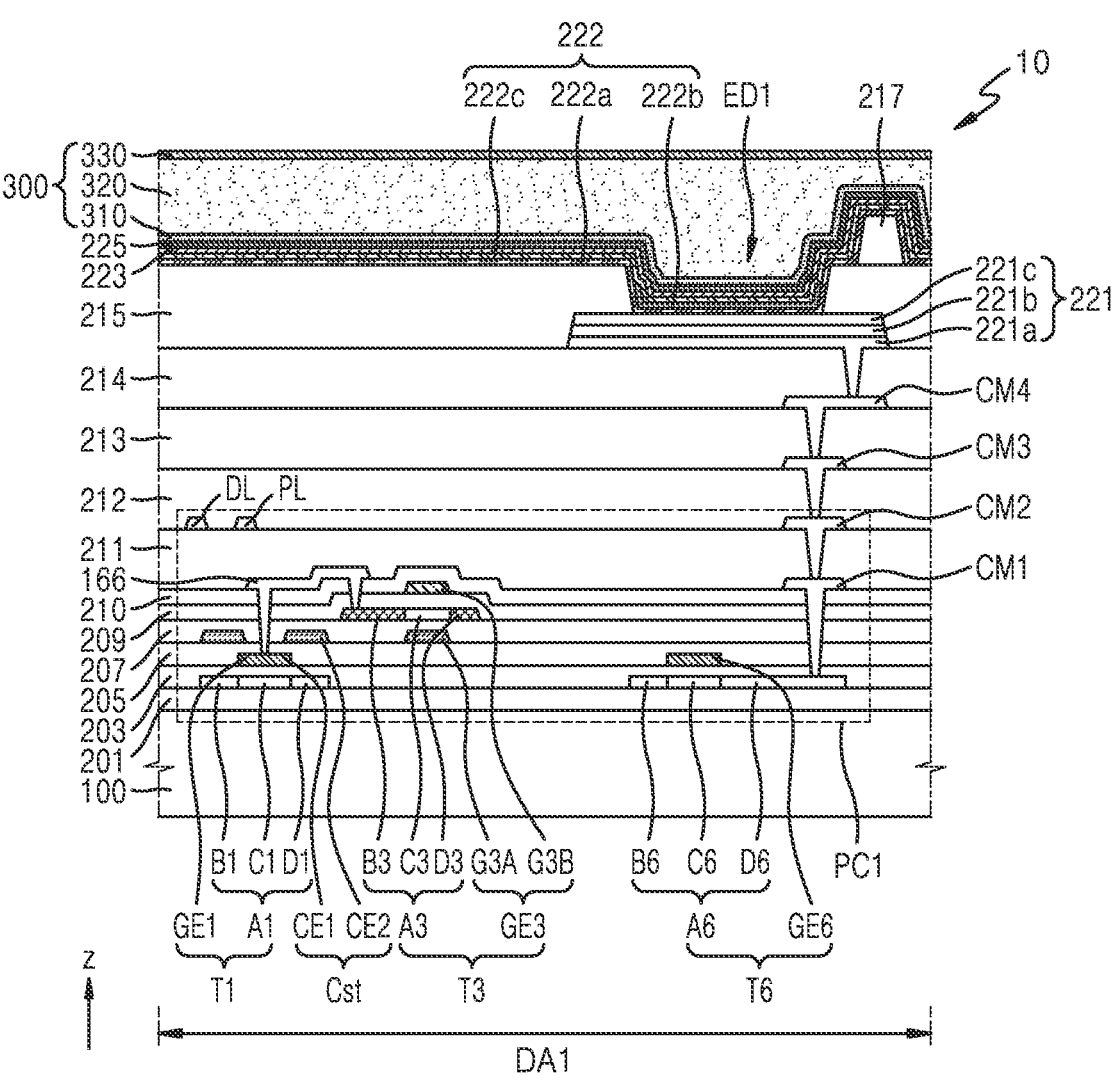
FIG. 5 is a cross-sectional view illustrating electrical connection between a first light-emitting diode and a first sub-pixel circuit of a display panel, according to some embodiments.

FIG. 5 is a cross-sectional view illustrating electrical connection of a first light-emitting diode and a first sub-pixel circuit of a display panel, according to some embodiments.

Referring to FIG. 5, the first sub-pixel circuit PC1 located on the substrate 100 and the first light-emitting diode ED1 on the first sub-pixel circuit PC1 may be located in the first display area DA1. The substrate 100 may include a glass material or a polymer resin as described with reference to FIG. 2.

A buffer layer 201 may be located on a top surface of the substrate 100. The buffer layer 201 may prevent or reduce instances of impurities or contaminants penetrating into a semiconductor layer of a transistor. The buffer layer 201 may include an inorganic insulating material such as silicon nitride, silicon oxynitride, or silicon oxide, and may have a single or multi-layer structure including the above inorganic insulating material.

The first sub-pixel circuit PC1 may be located on the buffer layer 201. As described with reference to FIG. 4, the first sub-pixel circuit PC1 may include a plurality of transistors and a storage capacitor. In this regard, FIG. 4 shows the first transistor T1, the third transistor T3, the sixth transistor T6, and the storage capacitor Cst The first transistor T1 may include a first semiconductor layer A1 and a first gate electrode GE1, wherein the first semiconductor layer A1 is on the buffer layer 201, and the first gate electrode GE1 overlaps a channel region C1 of the first semiconductor layer A1. The first semiconductor layer A1 may include a silicon-based semiconductor material, for example, polycrystalline silicon. The first semiconductor layer A1 may include the channel region C1, and a first region B1 and a second region D1 located on both sides of the channel region C1. The first region B1 and the second region D1 are regions having a higher impurity concentration than the channel region C1. One of the first region B1 and the second region D1 may correspond to a source region, and the other may correspond to a drain region.

The sixth transistor T6 may include a sixth semiconductor layer A6 and a sixth gate electrode GE6, wherein the sixth semiconductor layer A6 is on the buffer layer 201, and the sixth gate electrode GE6 overlaps a channel region C6 of the sixth semiconductor layer A6. The sixth semiconductor layer A6 may include a silicon-based semiconductor material, for example, polycrystalline silicon. The sixth semiconductor layer A6 may include the channel region C6, and a first region B6 and a second region D6 located on both sides of the channel region C6. The first region B6 and the second region D6 are regions having a higher impurity concentration than the channel region C1. One of the first region B6 and the second region D6 may correspond to a source region, and the other may correspond to a drain region.

Each of the first gate electrode GE1 and the sixth gate electrode GE6 may include a conductive material including molybdenum (Mo), aluminum (Al), copper (Cu), or titanium (Ti), and may have a single or multi-layer structure including the above material. A first gate insulating layer 203 may be located under the first gate electrode GE1 and the sixth gate electrode GE6, wherein the first gate insulating layer 203 is for electric insulation between the first semiconductor layer A1 and the sixth semiconductor layer A6. The first gate insulating layer 203 may include an inorganic insulating material such as silicon nitride, silicon oxynitride, or silicon oxide, and may have a single or multi-layer structure including the above inorganic insulating material.

The storage capacitor Cst may include the lower electrode CE1 and the upper electrode CE2 overlapping each other.

According to some embodiments, the lower electrode CE1 of the storage capacitor Cst may include the first gate electrode GE1. In other words, the first gate electrode GE1 may include the lower electrode CE1 of the storage capacitor Cst. For example, the first gate electrode GE1 and the lower electrode CE1 of the storage capacitor Cst may be one body.

A first interlayer insulating layer 205 may be located between the lower electrode CE1 and the upper electrode CE2 of the storage capacitor Cst. The first interlayer insulating layer 205 may include an inorganic insulating material such as silicon nitride, silicon oxynitride, or silicon oxide, and may have a single or multi-layer structure including the above inorganic insulating material.

The upper electrode CE2 of the storage capacitor Cst may include a low-resistance conductive material such as molybdenum (Mo), aluminum (Al), copper (Cu) and/or titanium (Ti), and may have a single or multi-layer structure including the above material.

A second interlayer insulating layer 207 may be located on the storage capacitor Cst. The second interlayer insulating layer 207 may include an inorganic insulating material such as silicon nitride, silicon oxynitride, or silicon oxide, and may have a single or multi-layer structure including the above inorganic insulating material.

A third semiconductor layer A3 of the third transistor T3 may be located on the second interlayer insulating layer 207. The third semiconductor layer A3 may include an oxide-based semiconductor material. For example, the third semiconductor layer A3 may include a Zn-oxide-based material, for example, Zn-oxide, In—Zn oxide, or Ga—In—Zn oxide. In some embodiments, the third semiconductor layer A3 may include an In—Ga—Zn—O (IGZO), In—Sn—Zn—O (ITZO), or In—Ga—Sn—Zn—O (IGTZO) semiconductor containing a metal such as indium (In), gallium (Ga), or stannum (Sn) in ZnO.

The third semiconductor layer A3 may include a channel region C3, and a first region B3 and a second region D3 located on both sides of the channel region C3. One of the first region B3 and the second region D3 may correspond to a source region, and the other may correspond to a drain region.

The third transistor T3 may include a third gate electrode GE3 overlapping the channel region C3 of the third semiconductor layer A3. The third gate electrode GE3 may have a double-gate structure including a lower gate electrode G3A and an upper gate electrode G3B, wherein the lower gate electrode G3A is under the third semiconductor layer A3, and the upper gate electrode G3B is over the channel region C3.

The lower gate electrode G3A may be on the same layer (e.g., the first interlayer insulating layer 205) as a layer on which the upper electrode CE2 of the storage capacitor Cst is located. The lower gate electrode G3A may include the same material as that of the upper electrode CE2 of the storage capacitor Cst.

The upper gate electrode G3B may be located over the third semiconductor layer A3 with a second gate insulating layer 209 therebetween. The second gate insulating layer 209 may include an inorganic insulating material such as silicon nitride, silicon oxynitride, or silicon oxide, and may having a single or multi-layer structure including the above inorganic insulating material.

A third interlayer insulating layer 210 may be located on the upper gate electrode G3B. The third interlayer insulating layer 210 may include an inorganic insulating material such as silicon oxynitride, and may have a single or multi-layer structure including the inorganic insulating material.

Although it is shown in FIG. 5 that the upper electrode CE2 of the storage capacitor Cst and the lower gate electrode G3A of the third gate electrode GE3 are located on the same layer, the disclosure is not limited thereto. According to some embodiments, the upper electrode CE2 of the storage capacitor Cst may be located on the same layer as the third semiconductor layer A3, and may include the same material as that of the first region B3 and the second region D3 of the third semiconductor layer A3.

The first transistor T1 may be electrically connected to the third transistor T3 through the node connection line 166. The node connection line 166 may be located on the third interlayer insulating layer 210. One side of the node connection line 166 may be connected to the first gate electrode GE1 of the first transistor T1, and the other side of the node connection line 166 may be connected to the first region B3 of the third semiconductor layer A3 of the third transistor T3.

The node connection line 166 may include aluminum (Al), copper (Cu), and/or titanium (Ti), and may have a single or multi-layer structure including the above material. For example, the node connection line 166 may have a three-layer structure including a titanium layer, an aluminum layer, and a titanium layer.

A first organic insulating layer 211 may be located on the node connection line 166. The first organic insulating layer 211 may include an organic insulating material. The organic insulating material may include acryl, benzocyclobutene (BCB), polyimide, or hexamethyldisiloxane (HMDSO).

The first organic insulating layer 211 may be located on the node connection line 166. The first organic insulating layer 211 may include an organic insulating material. The organic insulating material may include acryl, benzocyclobutene (BCB), polyimide, or hexamethyldisiloxane (HMDSO).

The data line DL and the driving voltage line PL may be located on the first organic insulating layer 211. Each of the data line DL and the driving voltage line PL may include aluminum (Al), copper (Cu), and/or titanium (Ti), and may have a single or multi-layer including the above material. For example, each of the data line DL and the driving voltage line PL may have a three-layer structure including a titanium layer, an aluminum layer, and a titanium layer.

Although it is shown in FIG. 5 that the data line DL and the driving voltage line PL are located on the same layer (e.g., the first organic insulating layer 211), according to some embodiments, the data line DL and the driving voltage line PL may be located on different layers.

A second organic insulating layer 212, a third organic insulating layer 213, and a fourth organic insulating layer 214 may be located on the first organic insulating layer 211. Each of the second organic insulating layer 212, the third organic insulating layer 213, and the fourth organic insulating layer 214 may include an organic insulating material such as acryl, benzocyclobutene, polyimide, or hexamethyldisiloxane (HMDSO).

A first electrode 221 of the first light-emitting diode ED1 may be located on the fourth organic insulating layer 214. The first electrode 221 may be electrically connected to the sixth transistor T6 through first through fourth connection metals CM1, CM2, CM3, and CM4. The first connection metal CM1 may be formed on the same layer as the node connection line 166, and may include the same material as a material of the node connection line 166. The second connection metal CM2 may be formed on the same layer as the data line DL and/or the driving voltage line PL, and may include the same material as a material of the data line DL and/or the driving voltage line PL. Each of the third connection metal CM3 and the fourth connection metal CM4 may include a conductive material, for example, a metal (e.g., a non-transmissive metal) or a light transmissive conductive material.

The first electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the first electrode 221 may further include a conductive oxide layer on and/or under the reflective layer. The conductive oxide layer may include indium tin oxide (ITO), indium zinc oxide (IZO), zinc oxide (ZnO), indium oxide ($In_2O_3$), indium gallium oxide (IGO), indium zinc gallium oxide, and/or aluminum zinc oxide (AZO). According to some embodiments, the first electrode 221 may include a plurality of sub-layers. For example, the first electrode 221 may include first through third sub-layers 221a, 221b, and 221c. The first through third sub-layers 221a, 221b, and 221c may respectively be an ITO layer, an Ag layer, and an ITO layer.

A bank layer 215 may be located on the first electrode 221. The bank layer 215 may include an opening that overlaps the first electrode 221 and may cover an edge of the first electrode 221. The bank layer 215 may include an organic insulating material such as polyimide.

A spacer 217 may be formed on the bank layer 215. The spacer 217 and the bank layer 215 may be formed together in the same process or may be individually formed in separate processes. According to some embodiments, the spacer 217 may include an organic insulating material such as polyimide. According to some embodiments, the bank layer 215 may include an organic insulating material including a light-blocking dye, and the spacer 217 may include an organic insulating material such as polyimide.

An intermediate layer 222 includes an emission layer 222b. The intermediate layer 222 may include a first functional layer 222a and/or a second functional layer 222c, wherein the first functional layer 222a is under the emission layer 222b, and the second functional layer 222c is over the emission layer 222b. The emission layer 222b may include a high molecular weight organic material or a low molecular weight organic material emitting light of a certain color (red, green, or blue). According to some embodiments, the emission layer 222b may include an inorganic material or quantum dots.

The second functional layer 222c may include an electron transport layer (ETL) and/or an electron injection layer (EIL). Each of the first functional layer 222a and the second functional layer 222c may include an organic material.

The emission layer 222b may be formed in the first display area DA1 to overlap the first electrode 221 through the opening of the bank layer 215. In contrast, an organic material layer, for example, the first functional layer 222a and the second functional layer 222c, included in the intermediate layer 222, may entirely cover the display area DA (see FIG. 3).

The intermediate layer 222 may have a single stack structure including a single emission layer, or a tandem structure that is a multi-stack structure including a plurality of emission layers. When the intermediate layer 222 has a tandem structure, a charge generation layer CGL may be located between the plurality of stacks.

A second electrode 223 may be formed of a conductive material having a low work function. For example, the second electrode 223 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the second electrode 223 may further include a layer formed of ITO, IZO, ZnO, or $In_2O_3$ on the (semi-)transparent layer including the above material. The second electrode 223 may entirely cover the display area DA (see FIG. 3).

A capping layer 225 may be located on the second electrode 223. The capping layer 225 may include an inorganic material or an organic material. The capping layer 225 may include lithium fluoride (LiF), an inorganic insulating material and/or an organic insulating material. The capping layer 225 may entirely cover the display area DA.

The first light-emitting diode ED1 may be covered by the encapsulation layer 300. The encapsulation layer 300 may include at least one organic encapsulation layer and at least one inorganic encapsulation layer. According to some embodiments, it is shown in FIG. 5 that the encapsulation layer 300 includes first and second inorganic encapsulation layers 310 and 330, and an organic encapsulation layer 320 located between the first and second inorganic encapsulation layers 310 and 330. The encapsulation layer 300 may be located on the capping layer 225.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. Each of the first inorganic encapsulation layer 310 and the second inorganic encapsulation layer 330 may have a single or multi-layer structure including the above material. The organic encapsulation layer 320 may include a polymer-based material. Examples of the polymer-based material may include an acrylic resin, an epoxy resin, polyimide, and polyethylene. According to some embodiments, the organic encapsulation layer 320 may include acrylate.

Figure 6:
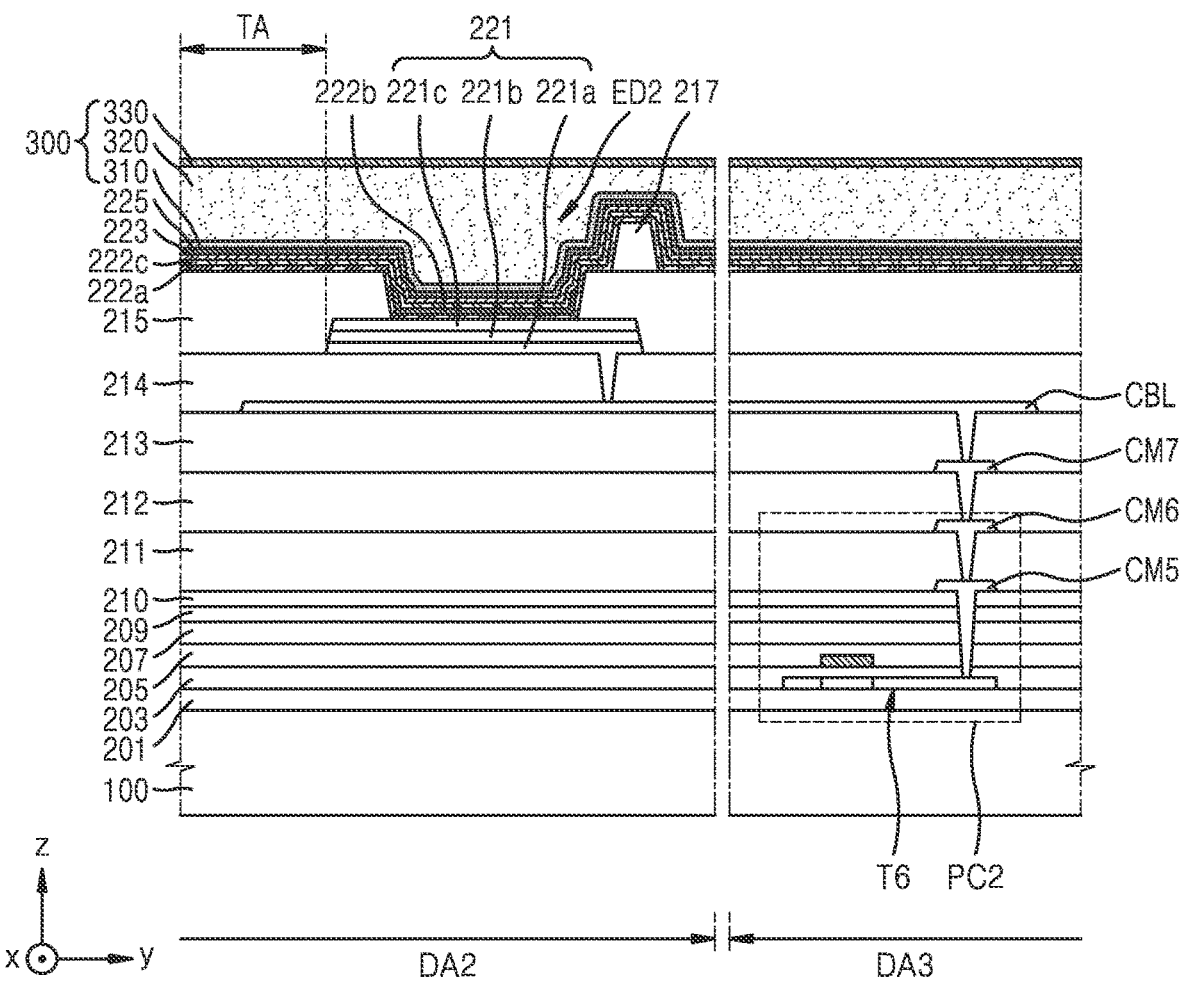
FIG. 6 is a cross-sectional view illustrating electrical connection of a second light-emitting diode and a second sub-pixel circuit of a display panel, according to some embodiments.

FIG. 6 is a cross-sectional view illustrating electrical connection of a second light-emitting diode and a second sub-pixel circuit of a display panel, according to some embodiments.

Referring to FIG. 6, the second sub-pixel circuit PC2 on the substrate 100 may be located in the third display area DA3, and the second light-emitting diode ED2 electrically connected to the second sub-pixel circuit PC2 may be located in the second display area DA2. As described with reference to FIG. 4, the second sub-pixel circuit PC2 may include a plurality of transistors and a storage capacitor. In this regard, FIG. 6 shows the sixth transistor T6 of the second sub-pixel circuit PC2. The buffer layer 201, the first gate insulating layer 203, the first interlayer insulating layer 205, the second interlayer insulating layer 207, the second gate insulating layer 209, the third interlayer insulating layer 210, and the first through fourth organic insulating layers 211, 212, 213, and 214, may be located on the substrate 100.

The second sub-pixel circuit PC2 may be electrically connected to the second light-emitting diode ED2 through the conductive bus line CBL extending from the third display area DA3 to the second display area DA2. For example, the conductive bus line CBL may extend in the second direction (e.g., y direction). The conductive bus line CBL may include a light transmissive conductive material. The light transmissive conductive material may include a transparent conductive oxide (TCO). The transparent conductive oxide may include a conductive oxide such as indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO). According, a decrease in a light transmittance of the transmissive area TA may be minimized.

The conductive bus line CBL may be electrically connected to the sixth transistor T6 of the second sub-pixel circuit PC2 through fifth through seventh connection metals CM5, CM6, and CM7. The fifth connection metal CM5 may be formed on the same layer as the first connection metal CM1 (see FIG. 5), and may include the same material as a material of the first connection metal CM1 (see FIG. 5). The sixth connection metal CM6 may be formed on the same layer as the second connection metal CM2 (see FIG. 5), and may include the same material as a material of the second connection metal CM2 (see FIG. 5). The seventh connection metal CM7 may be formed on the same layer as the third connection metal CM3 (see FIG. 5), and may include the same material as a material of the third connection metal CM3 (see FIG. 5).

The conductive bus line CBL may be electrically connected to the first electrode 221 of the second light-emitting diode ED2 located in the second display area DA2. For example, the first electrode 221 of the second light-emitting diode ED2 may be electrically connected to a first conductive bus line CBL1 through a contact hole of the fourth organic insulating layer 214. According to some embodiments, as described with reference to FIG. 5, the first electrode 221 may include the first sub-layer 221a including ITO, the second sub-layer 221b including Ag, and the third sub-layer 221c including ITO.

The bank layer 215 and the spacer 217 may be located on the first electrode 221 of the second light-emitting diode ED2, wherein the bank layer 215 includes an opening that overlaps the first electrode 221. In addition, as described with reference to FIG. 5, the first functional layer 222a, the emission layer 222b, the second functional layer 222c, the second electrode 223, the capping layer 225, and the encapsulation layer 300 may be located on the first electrode 221.

Figure 7:
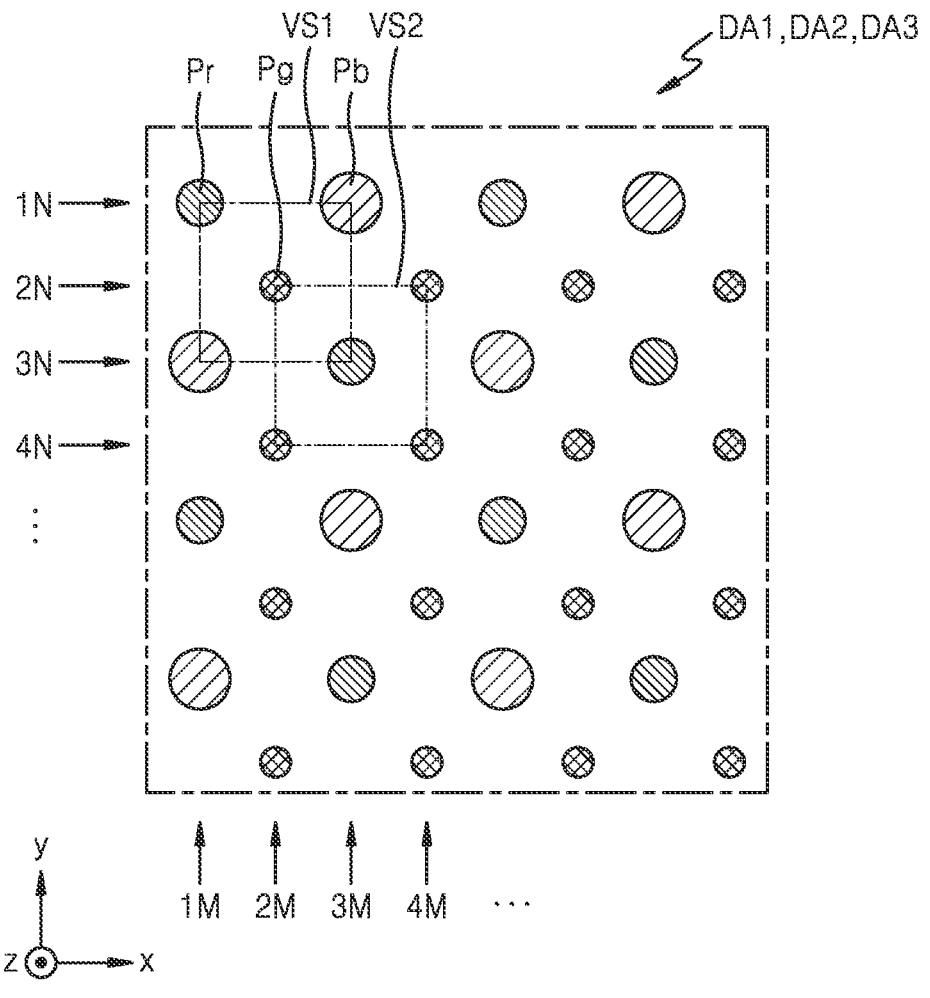
FIG. 7 is a plan view illustrating sub-pixels located in a display area of a display panel, according to some embodiments.

FIG. 7 is a plan view illustrating sub-pixels located in a display area of a display panel, according to some embodiments. Referring to FIG. 7, red, green, and blue sub-pixels Pr, Pg, and Pb respectively located in the first through third display areas DA1, DA2, and D3 may have the same arrangement in a plan view.

In some embodiments, the first through third display areas DA1, DA2, and D3 may have the same resolution. In other words, the number and/or area of sub-pixel circuits located in the first display area DA1 per same unit area, the number and/or area of sub-pixel circuits located in the second display area DA2 per same unit area, and the number and/or area of sub-pixel circuits located in the third display area DA3 per same unit area may be the same.

According to some embodiments, referring to FIG. 7, the red sub-pixel Pr, the green sub-pixel Pg, and the blue sub-pixel Pb may be located in a diamond PenTile™ type. In FIG. 7, 1N, 2N, 3N, 4N, . . . represent rows of sub-pixels, and 1M, 2M, 3M, 4M, . . . represent columns of sub-pixels.

For example, a plurality of red sub-pixels Pr and a plurality of blue sub-pixels Pb are alternately located in a first row 1N, a plurality of green sub-pixels Pg are located at a certain interval in a second row 2N adjacent to the first row 1N, a plurality of blue sub-pixels Pb and a plurality of red sub-pixels Pr are alternately located in a third row 3N adjacent to the second row 2N, and a plurality of green sub-pixels Pg are located at a certain interval in a fourth row 4N adjacent to the third row 3N. Such a sub-pixel arrangement is repeated. According to some embodiments, a size (or width) of each of the blue sub-pixel Pb and the red sub-pixel Pr may be greater than a size (or width) of the green sub-pixel Pg. A size (or width) of the blue sub-pixel Pb may be the same as or different from a size (or width) of the red sub-pixel Pr.

The plurality of red sub-pixels Pr and the plurality of blue sub-pixels Pb in the first row 1N, and the plurality of green sub-pixels Pg in the second row 2N are alternately located with each other. Accordingly, the red sub-pixels Pr and the blue sub-pixels Pb are alternately located in a first column 1M, the plurality of green sub-pixels Pg are spaced apart from each other by a certain interval in a second column 2M adjacent to the first column 1M, the blue sub-pixels Pb and the red sub-pixels Pr are alternately located in a third column 3M adjacent to the second column 2M, and the plurality of green sub-pixels Pg are spaced apart from each other by a certain interval in a fourth column 4M adjacent to the third column 3M. Such a sub-pixel arrangement is repeated.

When such a sub-pixel arrangement structure is differently expressed, from among vertexes of a first virtual quadrangle VS1 having the center of the green sub-pixel Pg as the center of the quadrangle, the red sub-pixels Pr are respectively located at first and third vertexes that are diagonally located, and the blue sub-pixels are respectively located at second and fourth vertexes that are the remaining vertexes.

When the sub-pixel arrangement structure is differently expressed, the green sub-pixels Pg are respectively arranged at vertexes of a second virtual quadrangle VS2 having the center of the red sub-pixel Pr or the blue sub-pixel Pb as the center of the quadrangle. The first and second virtual quadrangles VS1 and VS2 may be variously changed to a rectangle, a rhombus, a square, and the like.

Such a sub-pixel arrangement structure is referred to as a diamond PenTile™ type. By applying rendering, in which a color is represented by sharing colors of adjacent sub-pixels, a high resolution may be obtained via a small number of sub-pixels.

Figure 8:
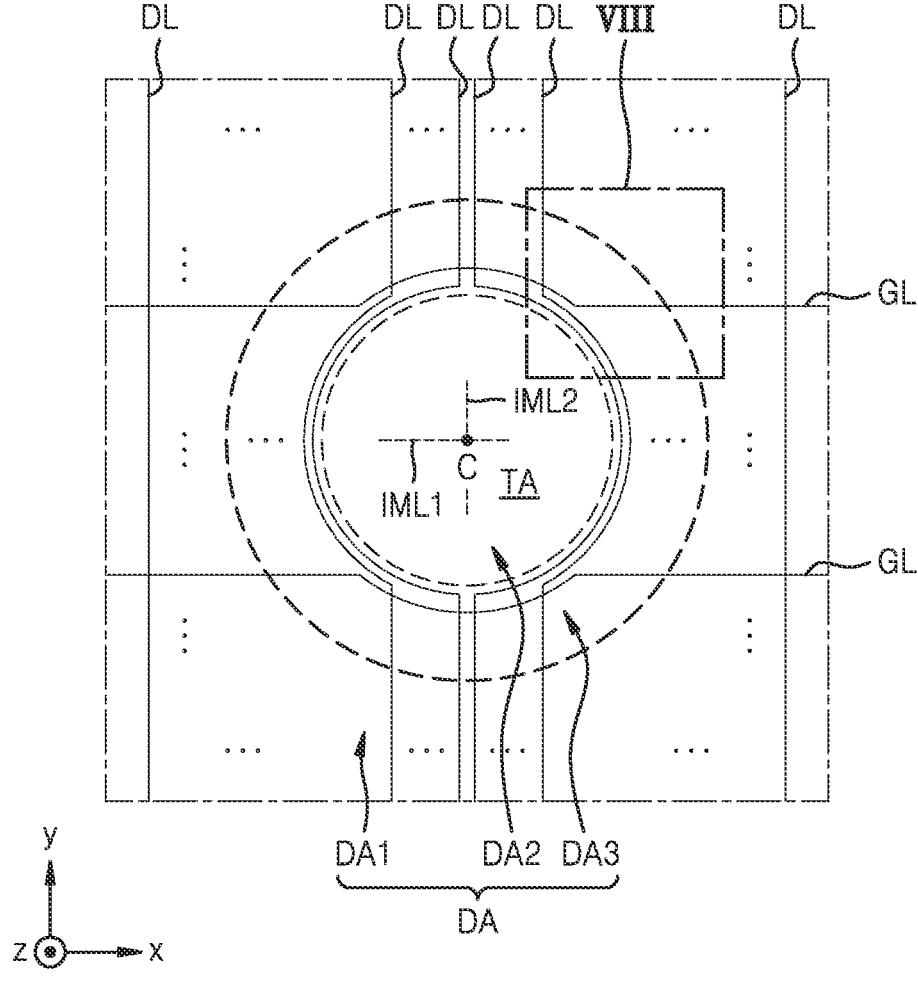
FIG. 8 is a plan view illustrating a part of a display panel, according to some embodiments.

FIG. 8 is a plan view illustrating a part of a display panel, according to some embodiments. For convenience of explanation, FIG. 8 shows signal lines, for example, the data lines DL and the gate lines GL, passing through the display area DA.

Referring to FIG. 8, the gate lines GL may substantially extend in the first direction (e.g., x direction). The gate lines GL may be bent or curved along an outer side of the second display area DA2 in the third display area DA3. For example, any one gate line GL may be bent or curved along an upper side of the second display area DA2 in the third display area DA3, and another gate line GL may be bent or curved along a lower side of the second display area DA2 in the third display area DA3. For example, the one gate line GL curved along the upper side of the second display area DA2 and the other gate line GL curved along the lower side of the second display area DA2 may be symmetrical to each other with respect to a first virtual line IML1 passing through the center C of the second display area DA2.

The gate line GL of FIG. 8 may be the scan line SL and/or the emission control line EL connected to the sub-pixel circuit PC (see FIG. 4) described with reference to FIG. 4. For example, the gate line GL may include the first gate line SL1 (see FIG. 4), the second gate line SL2 (see FIG. 4), the previous scan line SLp (see FIG. 4), the next scan line SLn (see FIG. 4), and/or the emission control line EL (see FIG. 4). In other words, the first gate line SL1 (see FIG. 4), the second gate line SL2 (see FIG. 4), the previous scan line SLp (see FIG. 4), the next scan line SLn (see FIG. 4), and/or the emission control line EL (see FIG. 4) electrically connected to sub-pixel circuits located in the third display area DA3 may be bent or curved in the third display area DA3 to partially surround the second display area DA2.

The data lines DL may substantially extend in the second direction (e.g., y direction). Some data lines DL may be bent or curved along an outer side of the second display area DA2 in the third display area DA3. For example, any one data line DL may be bent or curved along a left side of the second display area DA2 in the third display area DA3, and another data line DL may be bent or curved along a right side of the second display area DA2 in the third display area DA3. The one data line DL curved along the left side of the second display area DA2 and the other data line DL curved along the right side of the second display area DA2 may be symmetrical to each other with respect to a second virtual line IML2.

As described above, the data line DL and the gate line GL do not pass through the second display area DA2, and thus, the transmissive area TA may be sufficiently secured.

Figure 9A:
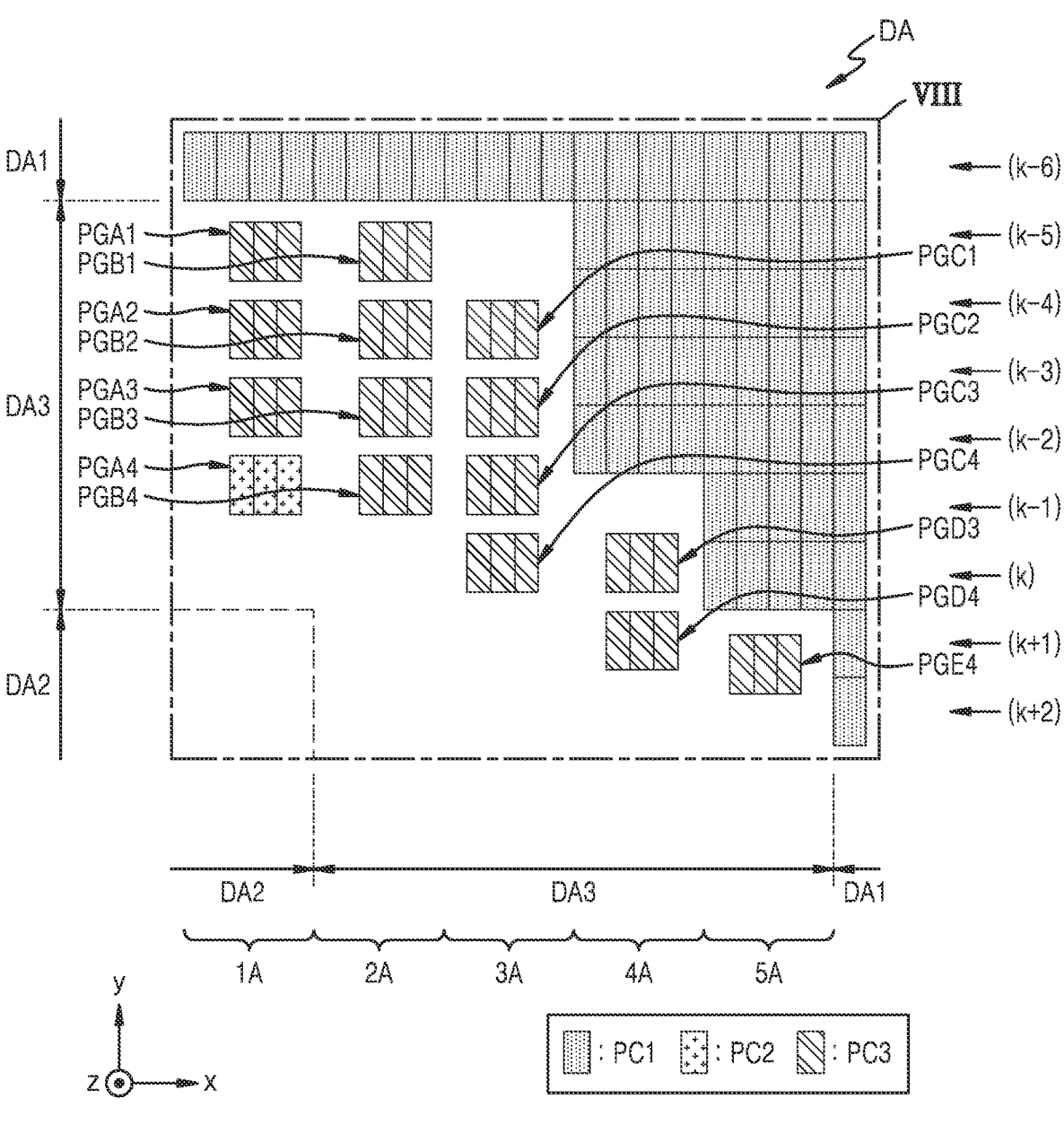
FIGS. 9A and 9B are plan views illustrating a portion VIII of a display panel of FIG. 8, according to some embodiments.
Figure 9B:
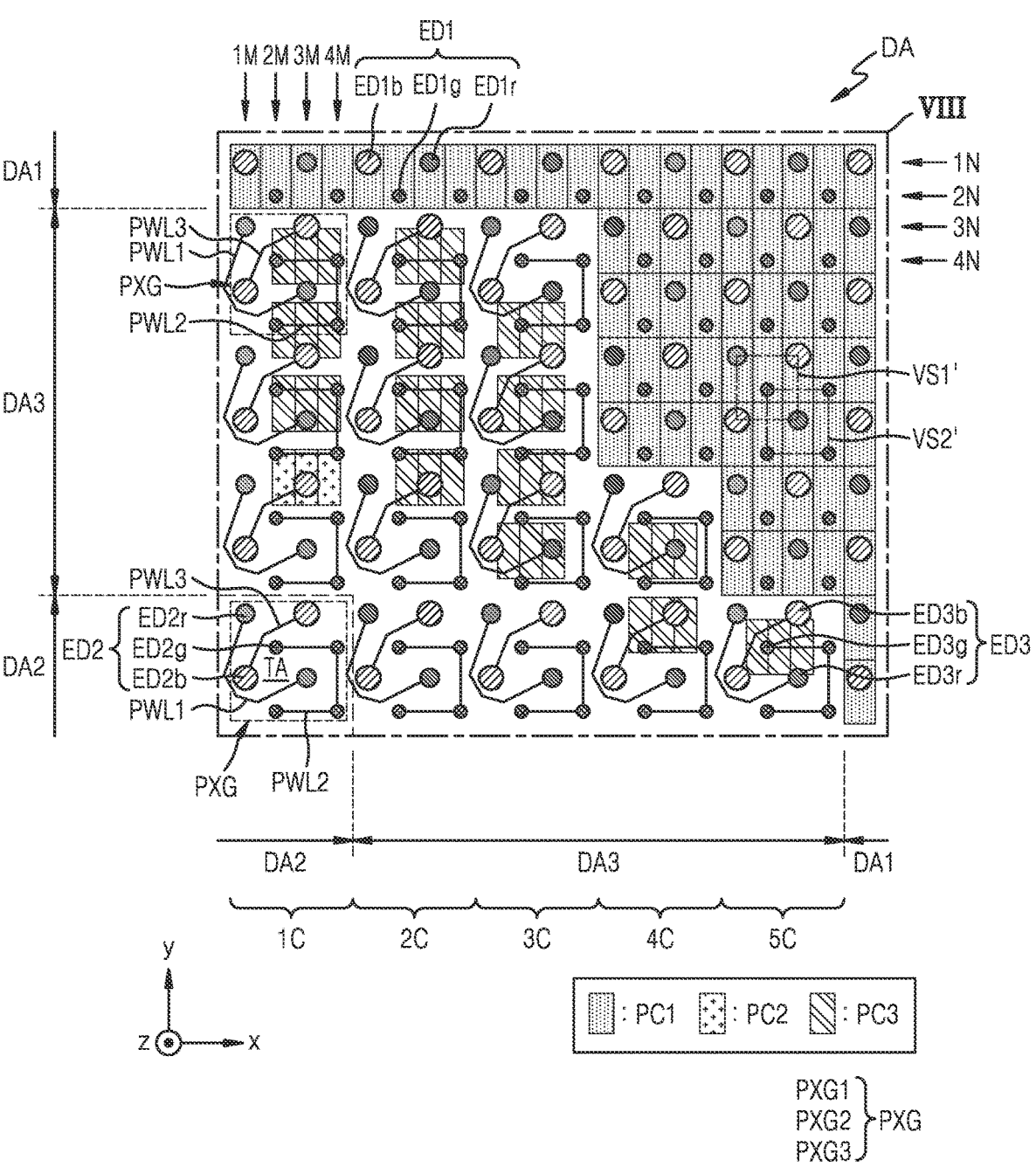

FIGS. 9A and 9B are plan views illustrating a portion VIII of a display panel of FIG. 8, according to some embodiments. For convenience of explanation, FIG. 9A shows sub-pixel circuits, and FIG. 9B shows light-emitting diodes electrically connected to the sub-pixel circuits of FIG. 9A.

Referring to FIG. 9A, sub-pixel circuits are located in the first display area DA1 and the third display area DA3, but are not located in the second display area DA2.

The sub-pixel circuits, for example, the first sub-pixel circuits PC1 located in the first display area DA1, may be arranged in rows and columns. The first sub-pixel circuits PC1 may be arranged at regular intervals in the first direction (e.g., x direction) and the second direction (e.g., y direction). In some embodiments, the first sub-pixel circuits PC1 adjacent to the third display area DA3 may be located to have a stepwise configuration in a plan view. In FIG. 9A, (k−6), (k−5), (k−4), (k−3), (k−2), (k−1), (k), (k+1), (k+2), . . . represent rows of the first sub-pixel circuit PC1.

The sub-pixel circuits located in the third display area DA3 may also be arranged in rows and columns. The sub-pixel circuits, for example, the second sub-pixel circuits PC2 and the third sub-pixel circuits PC3, located in the third display area DA3 may be arranged in rows and columns in the third display area DA3. The second sub-pixel circuits PC2 and the third sub-pixel circuits PC3 may form rows and columns different from rows and columns of the first sub-pixel circuits PC1 located in the first display area DA1. For example, three second sub-pixel circuits PC2 may form one sub-pixel circuit group, and three third sub-pixel circuits PC3 may form one sub-pixel circuit group.

Sub-pixel circuit groups may be arranged to be spaced apart from each other in the first direction (e.g., x direction) and/or the second direction (e.g., y direction) in the third display area DA3. In this regard, FIG. 9A shows sub-pixel circuit groups PGA1, PGA2, and PGA3 arranged in a first column 1A, sub-pixel circuit groups PGB1, PGB2, and PGB3 arranged in a second column 2A, sub-pixel circuit groups PGC1, PGC2, and PGC3 arranged in a third column 3A, sub-pixel circuit groups PGD3 and PGD4 arranged in a fourth column 4A, and a sub-pixel circuit group PGE4 arranged in a fifth column 5A in the second direction (e.g., y direction).

The sub-pixel circuit groups arranged in the third display area DA3 may be spaced apart from each other in the first direction (e.g., x direction, a row direction of the sub-pixel circuit groups). The sub-pixel circuit groups arranged in the third display area DA3 may be spaced apart from each other in the second direction (e.g., y direction, a column direction of the sub-pixel circuit groups).

The sub-pixel circuits arranged in the first and third display areas DA1 and DA3 may drive light-emitting diodes arranged in the first through third display areas DA1, DA2, and DA3.

Referring to FIG. 9B, the light-emitting diodes may include the first light-emitting diodes ED1 arranged in the first display area DA1, the second light-emitting diodes ED2 arranged in the second display area DA2, and the third light-emitting diodes ED3 arranged in the third display area DA3.

The first light-emitting diodes ED1 may include a first red light-emitting diodes ED1$r$, a first green light-emitting diodes ED1$g$, and a first blue light-emitting diodes ED1$b$. The second light-emitting diodes ED2 may include a second red light-emitting diodes ED2$r$, a second green light-emitting diodes ED2$g$, and a second blue light-emitting diodes ED2$b$. The third light-emitting diodes ED3 may include a third red light-emitting diodes ED3$r$, a third green light-emitting diodes ED3$g$, and a third blue light-emitting diodes ED3$b$.

An arrangement of red, green, and blue light-emitting diodes in the display area DA, may be substantially the same as an arrangement of red, green, and blue sub-pixels described with reference to FIG. 7. As shown in FIG. 9B, an arrangement of the first light-emitting diodes ED1 in the first display area DA1, an arrangement of the second light-emitting diodes ED2 in the second display area DA2, and an arrangement of the third light-emitting diodes ED3 in the third display area DA3 may be the same. Accordingly, resolutions of the first through third display areas DA1, DA2, and DA3 may be the same.

In the display area DA, red light-emitting diodes and blue light-emitting diodes may be alternately located in a first row 1N, a plurality of green light-emitting diodes may be spaced apart from each other by a certain interval in a second row 2N adjacent to the first row 1N, blue light-emitting diodes and red light-emitting diodes may be alternately located in a third row 3N adjacent to the second row 2N, and green light-emitting diodes may be spaced apart from each other by a certain interval in a fourth row 4N adjacent to the third row 4N.

The red light-emitting diodes and the blue light-emitting diodes located in the first row 1N, and the plurality of green light-emitting diodes located in the second row 2N may be alternately located. Accordingly, in the display area DA, the red light-emitting diodes and the blue light-emitting diodes are alternately located in a first column 1M, the plurality of green light-emitting diodes are spaced apart from each other by a certain interval in a second column 2M adjacent to the first column 1M, the blue light-emitting diodes and the red light-emitting diodes may be alternately located in a third column 3M adjacent to the second column 2M, and the plurality of green light-emitting diodes may be spaced apart from each other by a certain interval in the fourth column 4M adjacent to the third column 3M. Such a sub-pixel arrangement is repeated.

The arrangement of the light-emitting diodes is differently expressed as follows. For example, from among vertexes of a first virtual quadrangle VS1' having the center point of the first green light-emitting diode ED1$g$ arranged in the first display area DA1 as the center point of the quadrangle, the first red light-emitting diodes ED1$r$ may be respectively located at first and third vertexes that are diagonally located, and the first blue light-emitting diodes ED1$b$ may be respectively located at second and fourth vertexes that are the remaining vertexes. When the arrangement structure of the first light-emitting diodes ED1 is differently expressed, The first green light-emitting diodes ED1g may be respectively located at four vertexes of a second virtual quadrangle VS2′ having the center point of the first red light-emitting diode ED1r or the first blue light-emitting diode ED1b as the center point of the quadrangle.

The arrangement of the second red light-emitting diode ED2r, the second green light-emitting diode ED2g, and the second blue light-emitting diode ED2b in the second display area DA2 may be the same as the arrangement of the first red light-emitting diode ED1r, the first green light-emitting diode ED1g, and the first blue light-emitting diode ED1b. For example, from among vertexes of a first virtual quadrangle having the center point of the second green light-emitting diode ED2g as the center point of the quadrangle, the second red light-emitting diodes ED2r may be respectively located at vertexes in a first diagonal direction and the second blue light-emitting diodes ED2b may be respectively located at vertexes in a second diagonal direction. The second green light-emitting diodes ED2g may be respectively arranged at four vertexes of a second virtual quadrangle having the center point of the second red light-emitting diode ED2r or the second blue light-emitting diode ED2b as the center point of the quadrangle.

The arrangement of the third red light-emitting diode ED3r, the third green light-emitting diode ED3g, and the third blue light-emitting diode ED3b in the third display area DA3 may be the same as the arrangement of the first red light-emitting diode ED1r, the first green light-emitting diode ED1g, and the first blue light-emitting diode ED1b. For example, from among vertexes of a first virtual quadrangle having the center point of the third green light-emitting diode ED3g as the center point of the quadrangle, the third red light-emitting diodes ED3r may be respectively located at vertexes in the first diagonal direction and the third blue light-emitting diodes ED3b may be respectively located at vertexes in the second diagonal direction. In addition, the third green light-emitting diodes ED3g may be respectively located at four vertexes of a second virtual quadrangle having the center point of the third red light-emitting diode ED3r or the third blue light-emitting diode ED3b as the center point of the quadrangle.

The first light-emitting diodes ED1 in the first display area DA1 may be electrically connected to the first sub-pixel circuits PC1 in the first display area DA1. For example, one first light-emitting diodes ED1 may correspond to one first sub-pixel circuit PC1 (one-to-one correspondence). For example, the first red light-emitting diode ED1r may be electrically connected to the corresponding first sub-pixel circuit PC1, the first green light-emitting diode ED1g may be electrically connected to the corresponding first sub-pixel circuit PC1, and the first blue light-emitting diode ED1b may be electrically connected to the corresponding first sub-pixel circuit PC1.

The second and third light-emitting diodes ED2 and ED3 respectively located in the second display area DA2 and the third display area DA3 may be electrically connected to sub-pixel circuits located in the third display area DA3. In FIG. 9B, for convenience of explanation, light-emitting diodes (e.g., light-emitting diodes located in the second display area DA2 and the third display area DA3) electrically connected to each sub-pixel circuit group in the third display area DA3 are referred to as a light-emitting diode group PXG. Each light-emitting diode group PXG may include two red light-emitting diodes, two blue light-emitting diodes, and four green light-emitting diodes. For example, each light-emitting diode group PXG located in the second display area DA2 may include two second red light-emitting diodes ED2r, four second green light-emitting diodes ED2g, and two second blue light-emitting diodes ED2b. Each light-emitting diode group PXG located in the third display area DA3 may include two third red light-emitting diodes ED3r, four third green light-emitting diodes ED3g, and two third blue light-emitting diodes ED3b. In FIG. 9B, reference numerals 1C, 2C, 3C, 4C, and 5C represent columns of the light-emitting diode groups PXG.

The light-emitting diodes PXG arranged in the same column may be respectively and electrically connected to sub-pixel circuit groups arranged in the same column.

For example, the light-emitting diode groups PXG of the first column 1C may be respectively and electrically connected to the sub-pixel circuit groups PGA1, PGA2, PGA3, and PGA4 of the first column 1A described with reference to FIG. 9A. Some light-emitting diode groups PXG located in the third display area DA3 from among the light-emitting diode groups PXG of the first column 1C may be respectively and electrically connected to some sub-pixel circuit groups PGA1, PGA2, and PGA3 described with reference to FIG. 9A. The light-emitting diode group PXG located in the second display area DA2 from among the light-emitting diode groups PXG of the first column 1C may be electrically connected to the sub-pixel circuit group PGA4 located in the first column 1A described with reference to FIG. 9A. The light-emitting diode group PXG located in the second display area DA2 from among the light-emitting diode groups PXG of the first column 1C and the sub-pixel circuit group PGA4 located in the first column 1A may be electrically connected to each other by a conductive bus line as described with reference to FIGS. 3 and 6.

The light-emitting diode groups PXG of the second column 2C may be respectively and electrically connected to the sub-pixel circuit groups PGB1, PGB2, PGB3, and PGB4 of the second column 2A described with reference to FIG. 9A. The light-emitting diode groups PXG of the third column 3C may be respectively and electrically connected to the sub-pixel circuit groups PGC1, PGC2, PGC3, and PGC4 of the third column 3A described with reference to FIG. 9A. The light-emitting diode groups PXG of the fourth column 4C may be respectively and electrically connected to the sub-pixel circuit groups PGD3 and PGD4 of the fourth column 4A described with reference to FIG. 9A. The light-emitting diode group PXG of the fifth column 5C may be electrically connected to the sub-pixel circuit group PGE4 of the fifth column 5A described with reference to FIG. 9A.

Referring to FIGS. 9A and 9B, each sub-pixel circuit group located in the third display area DA3 includes three sub-pixel circuits. The three sub-pixel circuits may each be electrically connected to the plurality of second or third light-emitting diodes (one-to-many correspondence). For example, from among three sub-pixel circuits of each sub-pixel circuit group shown in FIG. 9A, one sub-pixel circuit may be electrically connected to two red light-emitting diodes (one-to-two correspondence) connected by a first connection line PWL1, another sub-pixel circuit may be electrically connected to four green light-emitting diodes (one-to-four correspondence) connected by a second connection line PWL2, and the other sub-pixel circuit may be electrically connected to two blue light-emitting diodes (one-to-two correspondence) connected by a third connection line PWL3.

For example, in the third display area DA3, any one sub-pixel circuit group (PGA1, PGA2, or PGA3) arranged in the first column 1A includes three third sub-pixel circuits PC3. One of the three third sub-pixel circuits PC3 may be electrically connected to any one of two third red light-emitting diodes ED3r, and the one third red light-emitting diode ED3r may be electrically connected to the other third red light-emitting diode ED3r through the first connection line PWL1 including a light transmissive conductive material. As described above, the two third red light-emitting diodes ED3r electrically connected to each other through the first connection line PWL1 may be electrically connected to one third sub-pixel circuit PC3. Similarly, another of the three third sub-pixel circuits PC3 may be electrically connected to four third green light-emitting diodes ED3g connected by the second connection line PWL2, and the other of the three third sub-pixel circuits PC3 may be electrically connected to two third blue light-emitting diodes ED3b connected by the third connection line PWL3.

The sub-pixel circuit group PGA4 arranged in the first column 1A in the third display area DA3 but adjacent to the second display area DA2 may include three second sub-pixel circuits PC2. The second sub-pixel circuits PC2 of the sub-pixel circuit group PGA4 adjacent to the second display area DA2 may be electrically connected to the second light-emitting diodes ED2 located in the second display area DA2.

The three second sub-pixel circuits PC2 of the sub-pixel circuit group PGA4 arranged in the first column 1A but adjacent to the second display area DA2 may be electrically connected to the second light-emitting diodes ED2 of the light-emitting diode group PXG arranged in the first column 1C but located in the second display area DA2. For example, one second sub-pixel circuit PC2 from among the three second sub-pixel circuits PC2 of the sub-pixel circuit group PGA4 may be electrically connected to two second red light-emitting diodes ED2r included in a light-emitting diode group PXG1 of the second display area DA2, another second sub-pixel circuit PC2 may be electrically connected to four second green light-emitting diodes ED2g through a second conductive bus line CBL2, and the other second sub-pixel circuit PC2 may be electrically connected to two second blue light-emitting diodes ED2b.

Figure 10A:
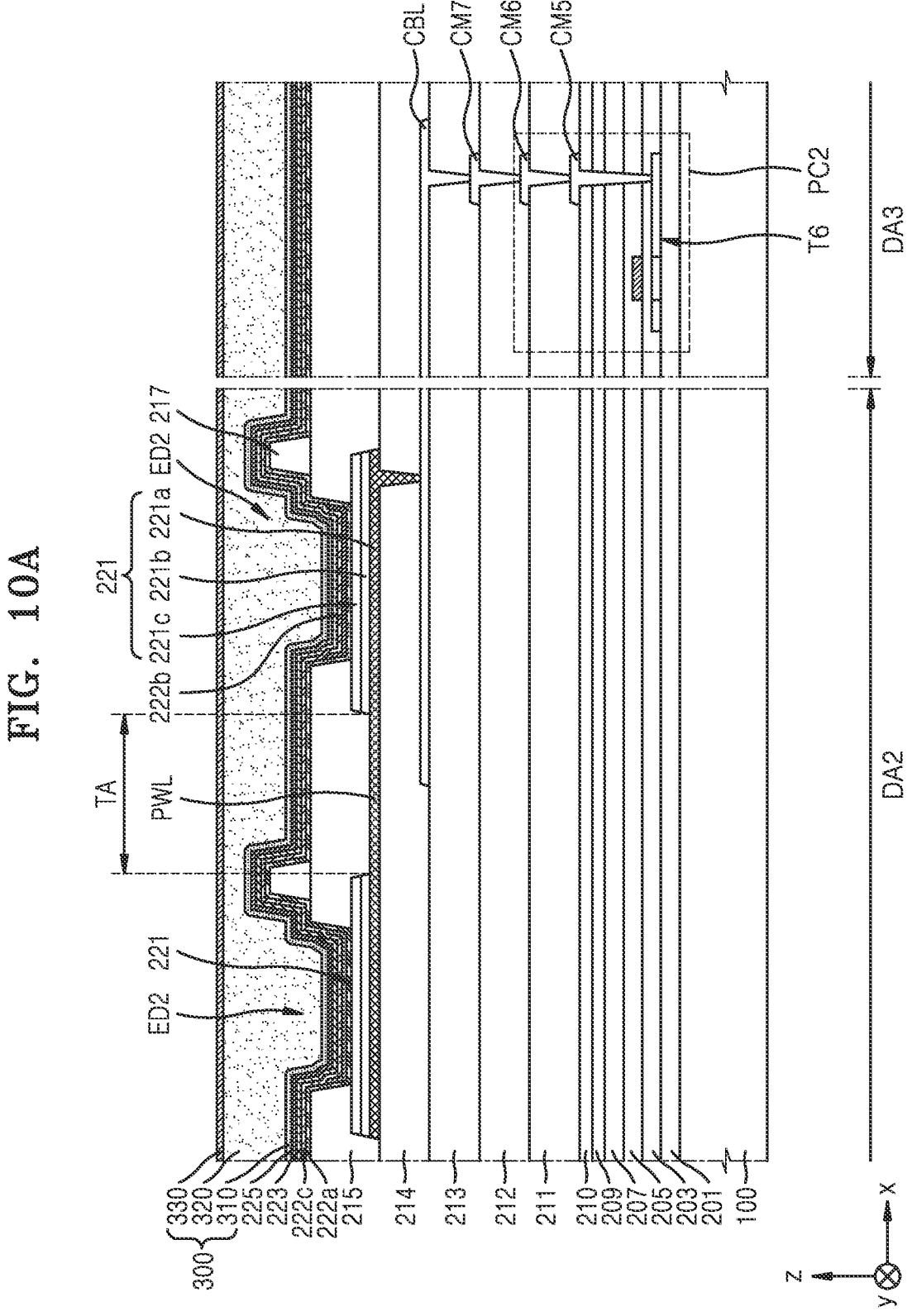
Figure 10B:
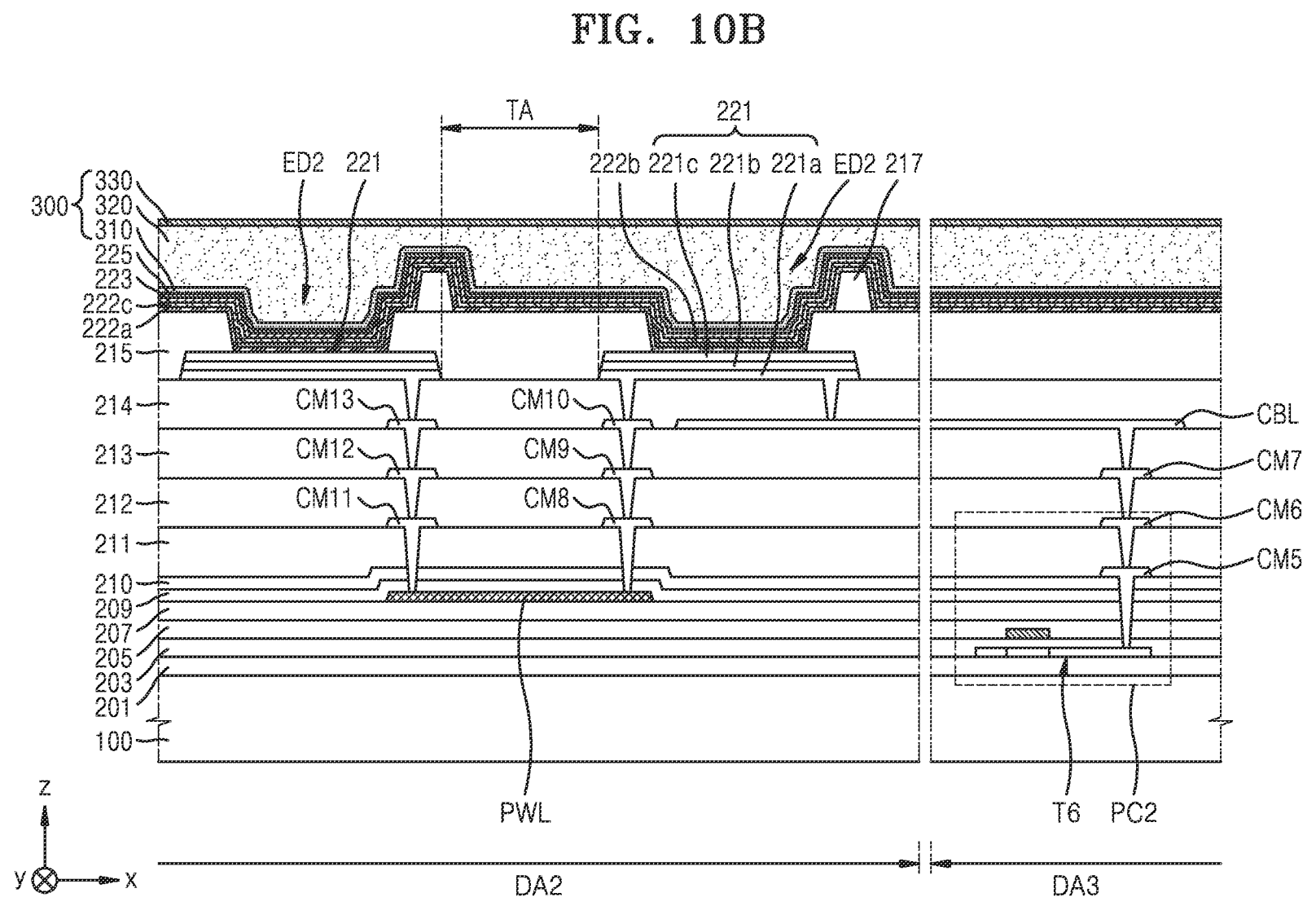

FIGS. 10A and 10B are cross-sectional views illustrating that a second light-emitting diode and a second sub-pixel circuit of a display panel are electrically connected through a connection line, according to some embodiments.

The second light-emitting diode ED2 of FIGS. 10A and 10B may be located in the second display area DA2, and may be electrically connected to the second sub-pixel circuit PC2 located in the third display area DA3 through the conductive bus line CBL. The second light-emitting diode ED2 electrically connected to the second sub-pixel circuit PC2 may be electrically connected to another second light-emitting diode ED2 that emits light of the same color through a connection line PWL. An electrical connection structure between the second sub-pixel circuit PC2 and the second light-emitting diode ED2 through the conductive bus line CBL is the same as that described with reference to FIG. 5, and thus, the connection line PWL will be mainly described.

As shown in FIG. 10A, the connection line PWL may be located on the same layer (e.g., the fourth organic insulating layer 214) as the first electrodes 221 of the two second light-emitting diodes ED2 connected by the connection line PWL. The connection line PWL may be integrally connected to any one sub-layer included in each of the two first electrodes 221 connected by the connection line PWL. For example, the connection line PWL may be integrally formed with the first sub-layer 221a that is a lowermost layer from among sub-layers of the first electrode 221. The connection line PWL may be formed together in a process of forming the first electrode 221. According to some embodiments, the first sub-layer 221a may include ITO, and the connection line PWL may include crystallized ITO. The second light-emitting diodes ED2 electrically connected to each other by the connection line PWL may emit light of the same color.

According to some embodiments, the connection line PWL may be located between the substrate 100 and the first electrode 221. Referring to FIG. 10B, the connection line PWL may be located between the substrate 100 and the first electrode 221 of the second light-emitting diode ED2. For example, the connection line PWL may be located on the same layer (e.g., the second interlayer insulating layer 207) as the third semiconductor layer of the third thin film transistor described with reference to FIG. 5. The connection line PWL may include the same material as that of the third semiconductor layer. In more detail, the connection line PWL may be conductive like the first region and the second region of the third semiconductor layer. Because the connection line PWL including an oxide-based semiconductor material is light transmissive, even when the connection line PWL is located in the transmissive area TA, a sufficient transmittance of the transmissive area TA may be ensured.

An end of the connection line PWL may be electrically connected to the first electrode 221 of any one second light-emitting diode ED2 through eighth through tenth connection metals CM8, CM9, and CM10. The other end of the connection line PWL may be electrically connected to the first electrode 221 of another second light-emitting diode ED2 through $11^{th}$ through $13^{th}$ connection metals CM11, CM12, and CM13.

The connection line PWL of FIGS. 10A and 10B may correspond to the first through third connection lines PWL1, PWL2, and PWL3 described with reference to FIG. 9B. The connection line PWL of FIGS. 10A and 10B may be applied to a connection line of the third light-emitting diodes ED3 located in the third display area DA3 described with reference to FIG. 9B. For example, each of a first connection line that connects two third red light-emitting diodes, a second connection line that connections four third green light-emitting diodes, and a third connection line that connects two third red light-emitting diodes included in each light-emitting diode group described with reference to FIG. 9B may have the same structure as that of the connection line PWL of FIG. 10A or 10B.

Figure 11:
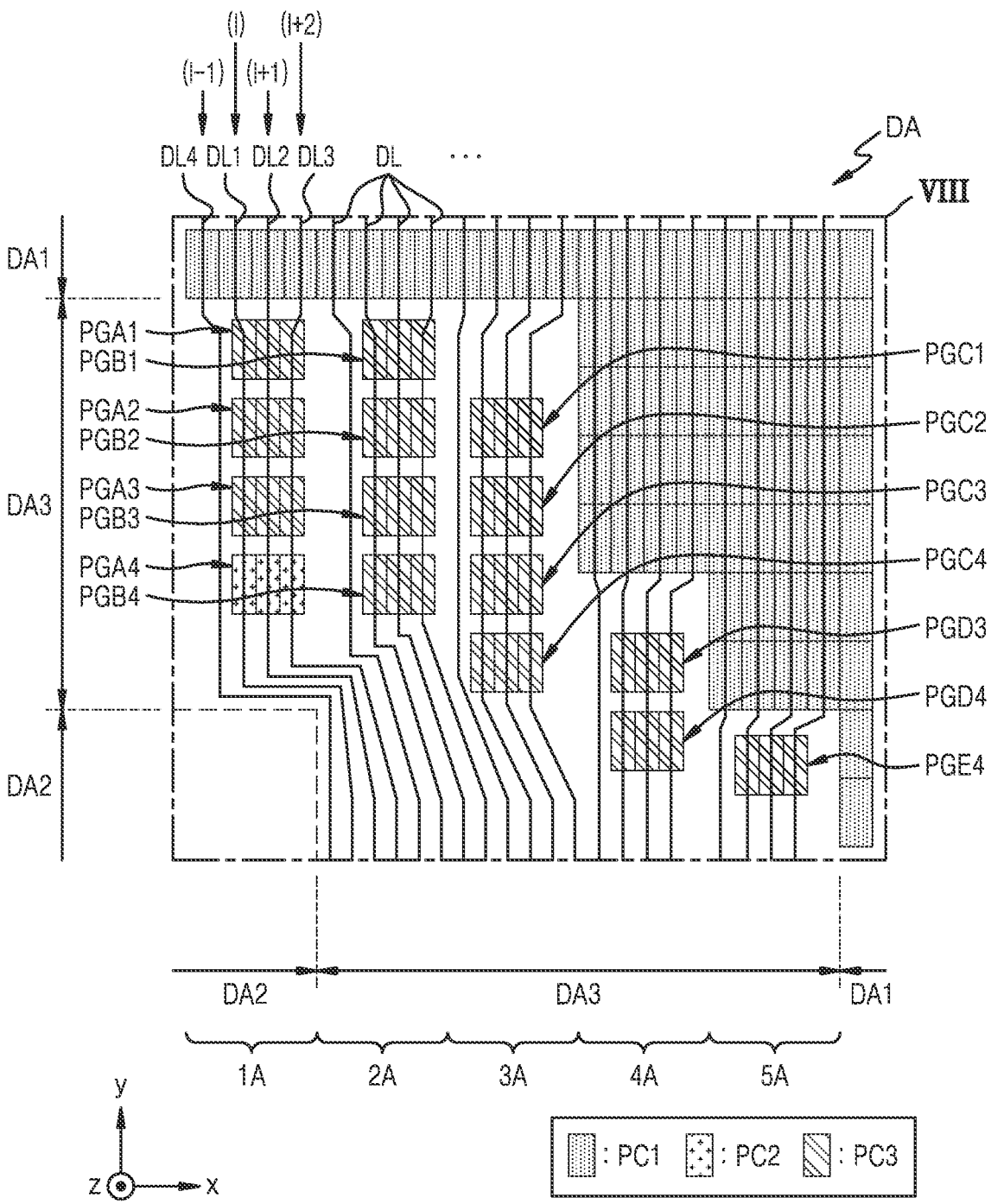
FIG. 11 is a plan view illustrating data lines connected to sub-pixel circuits corresponding to a portion VIII of a display panel of FIG. 8, according to some embodiments.

FIG. 11 is a plan view illustrating data lines connected to sub-pixel circuits corresponding to a portion VIII of a display panel of FIG. 8, according to some embodiments.

Referring to FIG. 11, the data line DL may be electrically connected to the first sub-pixel circuits PC1 arranged in the first display area DA1 and the second and third sub-pixel circuits PC2 and PC3 arranged in the third display area DA3. Because sub-pixel circuits are not located in the second display area DA2, the data lines DL electrically connected to the sub-pixel circuits located in the third display area DA3 may bypass the second display area DA2 in the third display area DA3. For example, at least one of the data lines DL may be bent or curved to partially surround the second display area DA2.

Any one data line (hereinafter, referred to as a first data line DL1) electrically connected to the first sub-pixel circuit PC1 arranged in an $(I)^{th}$ column (I is a natural number) may be electrically connected to sub-pixel circuits arranged in the same column in the third display area DA3. In this regard, FIG. 11 shows that the first data line DL1 is electrically connected to the third sub-pixel circuit PC3 and the second sub-pixel circuit PC2 arranged in the same column from among the sub-pixel circuit groups PGA1, PGA2, PGA3, and PGA4 located in the first column 1A. In a plan view, a part (hereinafter, referred to as a bypassing portion) of the first data line DL1 may be located in the third display area DA3 but may be bent or curved to partially surround the second display area DA2.

A data line (hereinafter, referred to as a second data line DL2) electrically connected to the first sub-pixel circuit PC1 arranged in an $(I+1)^{th}$ column may be electrically connected to sub-pixel circuits arranged in the same column in the third display area DA3. In this regard, FIG. 11 shows that the second data line DL2 is electrically connected to the third sub-pixel circuit PC3 and the second sub-pixel circuit PC2 arranged in the same column from among the sub-pixel circuit groups PGA1, PGA2, PGA3, and PGA4 located in the second column 2A. In a plan view, a part (hereinafter, referred to as a bypassing portion) of the second data line DL2 may be located in the third display area DA3 but may be bent or curved to partially surround the second display area DA2.

A data line (hereinafter, referred to as a third data line DL3) electrically connected to the first sub-pixel circuit PC1 arranged in an $(I+2)^{th}$ column may be electrically connected to the first sub-pixel circuit PC1 of the first display area DA1, and the third sub-pixel circuit PC3 and the second sub-pixel circuit PC2 arranged in the same column in the third display area DA3.

A data line (hereinafter, referred to as a fourth data line DL4) electrically connected to the first sub-pixel circuit PC1 arranged in an $(I-1)^{th}$ column may be electrically connected to the first sub-pixel circuit PC1 of the first display area DA1 but may not be electrically connected to a sub-pixel circuit located in the third display area DA3. A part of the fourth data line DL4 may be located in the third display area DA3, but may be bent or curved to partially surround the second display area DA2.

A structure of the first through fourth data lines DL1, DL2, DL3, and DL4 as described above may be applied to other sub-pixel circuit groups arranged in other columns in the third display area DA3. For example, three data lines DL electrically connected to sub-pixel circuits of the sub-pixel circuit groups PGB1, PGB2, PGB3, and PGB4 of the second column 2A may be electrically connected to the first sub-pixel circuits PC1 adjacent to the second column 2A. The other data line DL may pass between the sub-pixel circuit groups PGA1, PGA2, PGA3, and PGA4 of the first column 1A and the sub-pixel circuit groups PGB1, PGB2, PGB3, and PGB4 of the second column 2A.

Likewise, three data lines DL electrically connected to sub-pixel circuits of the sub-pixel circuit groups PGC1, PGC2, PGC3, and PGC4 of the third column 3A may be electrically connected to the first sub-pixel circuits PC1 adjacent to the third column 3A. The other data line DL may pass between the sub-pixel circuit groups PGB1, PGB2, PGB3, and PGB4 of the second column 2A and the sub-pixel circuit groups PGC1, PGC2, PGC3, and PGC4 of the third column 3A.

Figure 12:
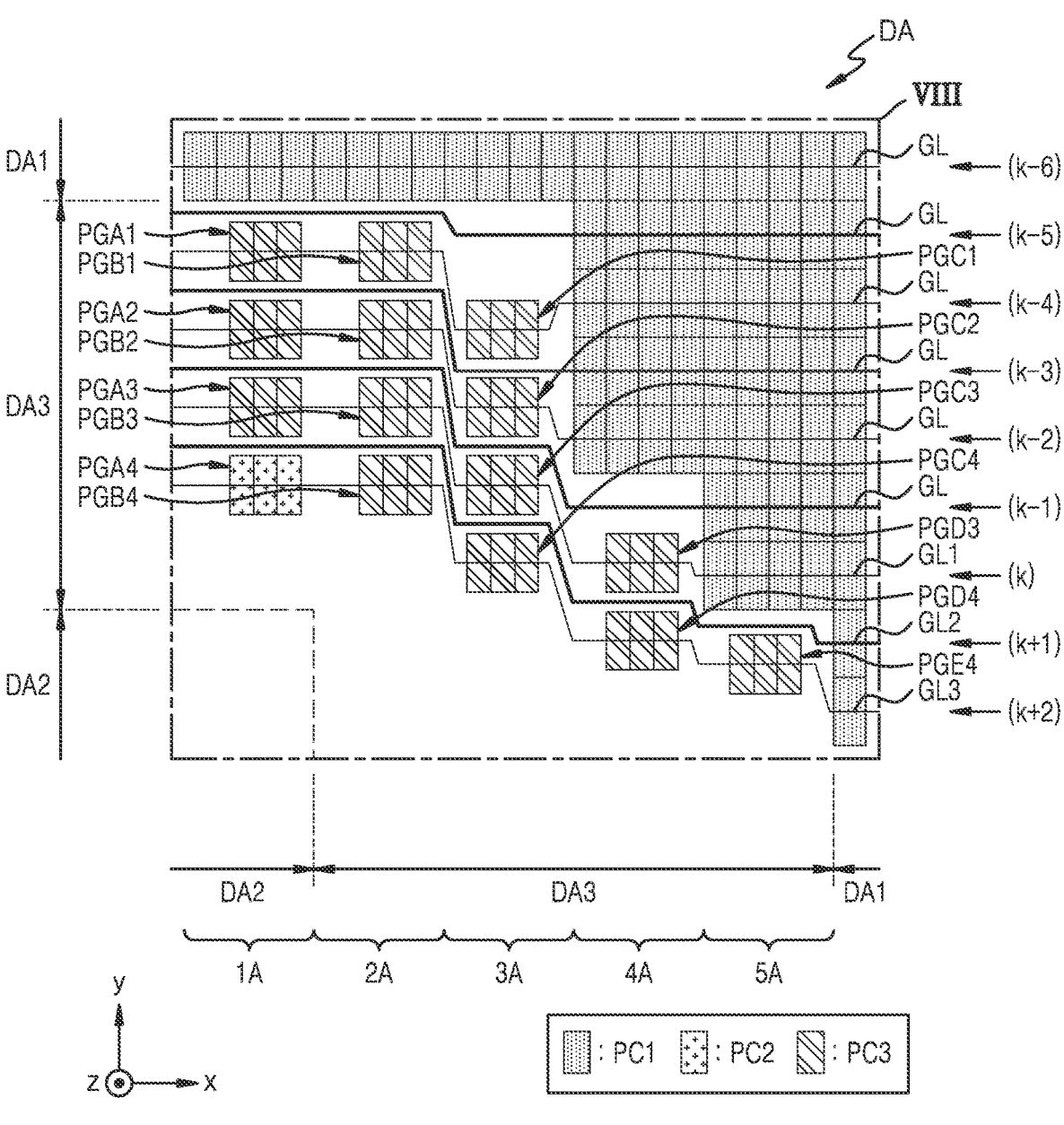
FIG. 12 is a plan view illustrating gate lines connected to sub-pixel circuits corresponding to a portion VIII of a display panel of FIG. 8, according to some embodiments.

FIG. 12 is a plan view illustrating gate lines connected to sub-pixel circuits corresponding to a portion VIII of a display panel of FIG. 8, according to some embodiments.

The gate line GL may be electrically connected to the first sub-pixel circuits PC1 arranged in the first display area DA1 and the second and third sub-pixel circuits PC2 and PC3 arranged in the third display area DA3. Because sub-pixel circuits are not located in the second display area DA2, the gate lines GL electrically connected to the sub-pixel circuits located in the third display area DA3 may bypass the second display area DA2 in the third display area DA3. For example, at least one of the gate lines GL may be bent or curved to partially surround the second display area DA2.

Any one gate line (hereinafter, referred to as a first gate line GL1) electrically connected to the first sub-pixel circuit PC1 arranged in a $(k)^{th}$ row (k is a natural number) may be electrically connected to sub-pixel circuits arranged in the third display area DA3. In this regard, FIG. 12 shows that the first gate line GL1 is electrically connected to the third sub-pixel circuit PC3 of the sub-pixel circuit groups PGD3, PGC3, PGB2, and PGA3.

Some of the sub-pixel circuit groups PGD3, PGC3, PGB2, and PGA3 electrically connected to the first gate line GL1 may have a stepwise arrangement in a plan view, and the first gate line GL1 may be bent like an arrangement of the sub-pixel circuit groups PGD3, PGC3, PGB2, and PGA3. The bent first gate line GL1 may bypass the second display area DA2 in the third display area DA3. In other words, a part (hereinafter, referred to as a bypassing portion) of the first gate line GL1 may be located in the third display area DA3, but may be bent to partially surround the second display area DA2.

Any one gate line (hereinafter, referred to as a second gate line GL2) electrically connected to the first sub-pixel circuit PC1 arranged in a $(k+1)^{th}$ row may bypass the second display area DA2 in the third display area DA3. The second gate line GL2 may bypass the second display area DA2 in the third display area DA3 outside the second display area DA2. Likewise, any one gate line (hereinafter, referred to as a third gate line GL3) electrically connected to the first sub-pixel circuit PC1 arranged in a $(k+2)^{th}$ row may bypass the second display area DA2 in the third display area DA3. The third gate line GL3 may bypass the second display area DA2 in the third display area DA3 outside the second display area DA2.

The third gate line GL3 may be electrically connected to the first sub-pixel circuit PC1 arranged in the $(k+2)^{th}$ row and sub-pixel circuits arranged in the third display area DA3. In this regard, FIG. 12 shows that the third gate line GL3 is electrically connected to the third sub-pixel circuit PC3 and the second sub-pixel circuit PC2 of the sub-pixel circuit groups PGE4, PGD4, PGC4, PGB4, and PGA4.

Some of the sub-pixel circuit groups PGE4, PGD4, PGC4, PGB4, and PGA4 electrically connected to the third gate line GL3 may have a stepwise arrangement in a plan view, and the third gate line GL3 may also be bent like an arrangement of the sub-pixel circuit groups PGE4, PGD4, PGC4, PGB4, and PGA4. The bent third gate line GL3 may bypass the second display area DA2 in the third display area DA3. In other words, a part (hereinafter, referred to as a bypassing portion) of the third gate line GL3 may be located in the third display area DA3, but may be bent to partially surround the second display area DA2.

The second gate line GL2 may be electrically connected to the first sub-pixel circuit PC1 arranged in the $(k+1)^{th}$ row, but may not be electrically connected to sub-pixel circuits located in the third display area DA3. The second gate line GL2 may pass between two sub-pixel circuits adjacent to each other in the second direction (e.g., y direction) from among the sub-pixel circuits of the third display area DA3.

For example, two sub-pixel circuits adjacent to each other in the second direction (e.g., y direction) in the third display area DA3 may be respectively and electrically connected to the first gate line GL1 and the third gate line GL3. The two sub-pixel circuits respectively and electrically connected to the first gate line GL1 and the third gate line GL3 may be spaced apart from each other to have a gap, and a part of the second gate line GL2 may extend to pass through a portion corresponding to the gap. A part of the second gate line GL2 may correspond to a bypassing portion bypassing the second display area DA2 while passing between two sub-pixel circuits adjacent to each other in the second direction (e.g., y direction) in the third display area DA3.

A structure described with reference to the first through third gate lines GL1, GL2, and GL3 may be applied to other gate lines. For example, gate lines electrically connected to the first sub-pixel circuits PC1 arranged in a $(k-6)^{th}$ row, a $(k-4)^{th}$ row, a $(k-2)^{th}$ row, the $(k)^{th}$ row, and the $(k+2)^{th}$ row may be respectively and electrically connected to sub-pixel circuits arranged in the third display area DA3.

Gate lines electrically connected to the first sub-pixel circuits PC1 arranged in a $(k-5)^{th}$ row, a $(k-3)^{th}$ row, a $(k-1)^{th}$ row, and the $(k+1)^{th}$ row may pass through the third display area DA3 outside the second display area DA2, and may extend to pass between two sub-pixel circuits adjacent to each other in the second direction (e.g., y direction) in the third display area DA3.

In a comparative example, when gate lines electrically connected to the first sub-pixel circuits PC1 arranged in the $(k-5)^{th}$ row, the $(k-3)^{th}$ row, the $(k-1)^{th}$ row, and the $(k+1)^{th}$ row are disconnected without bypassing the second display area DA2 in the third display area DA3, luminance non-uniformity of an image provided through the display panel may occur. For example, when the second and third display areas DA2 and DA3 are spaced apart from the virtual line IML passing through the center of the display area DA as shown in FIG. 3, resistances of gate lines spaced apart from each other and located on both sides with the second and third display areas DA2 and DA3 therebetween may be different and luminance non-uniformity of an image provided through the display panel may occur. However, according to some embodiments, because gate lines (e.g., the first through third gate lines GL1, GL2, and GL3) electrically connected to the first sub-pixel circuits PC1 adjacent to the second and third display areas DA2 and DA3 are not disconnected and bypass the outside of the second display area DA2, the above problems may be prevented or reduced.

As described with reference to the second gate line GL2, because a bypassing portion of each of gate lines not electrically connected to sub-pixel circuits of the third display area DA3 passes between two sub-pixel circuits adjacent to each other in the second direction (e.g., y direction) in the third display area DA3, the bypassing portion may not overlap the sub-pixel circuits. Accordingly, interference between the bypassing portion of the second gate line GL2 and other signal lines passing through the sub-pixel circuits may be prevented or reduced.

Figure 13:
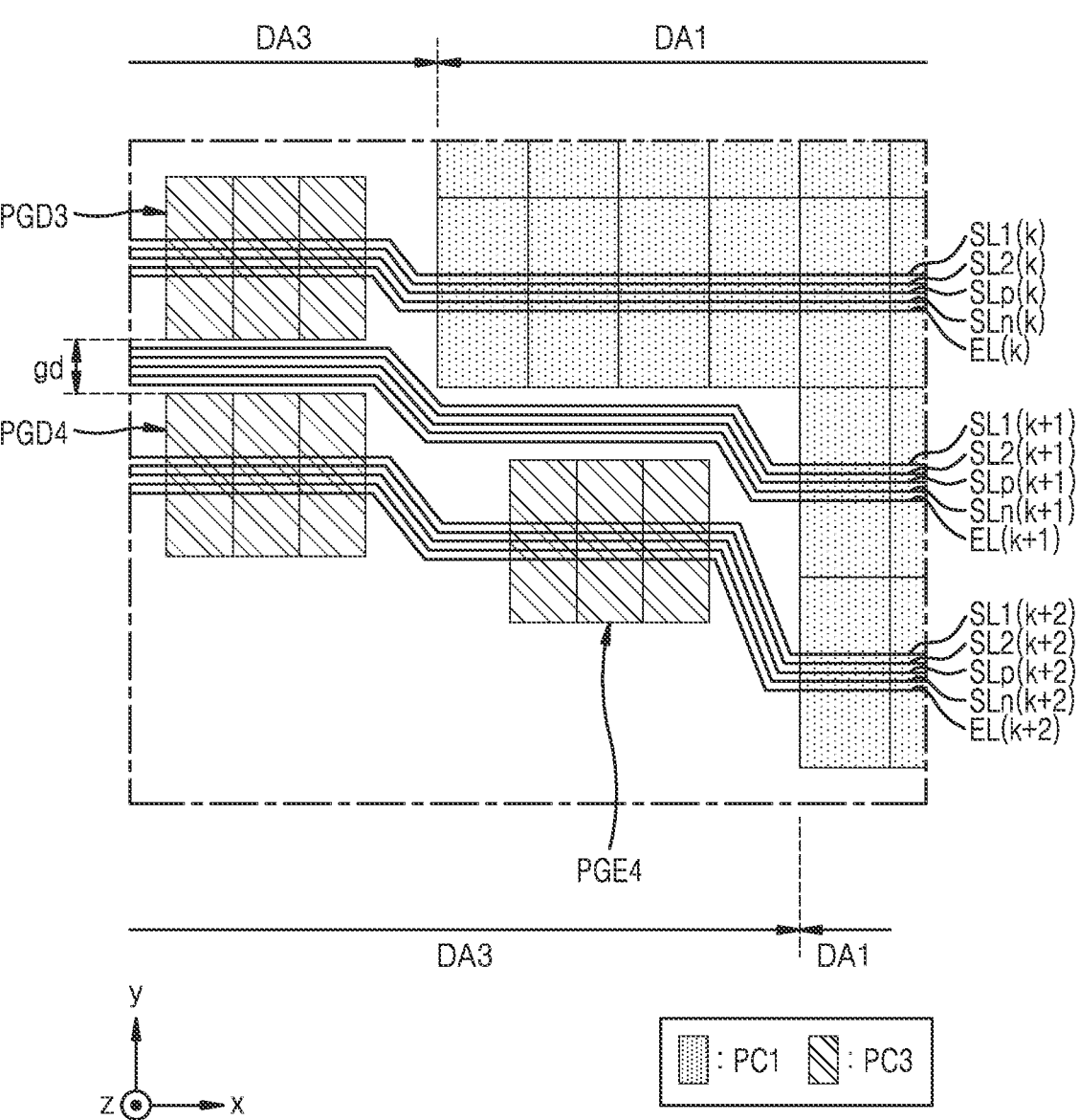
FIG. 13 is a plan view illustrating gate lines arranged in a $(k)^{th}$ row, a $(k+1)^{th}$ row, and $(k+2)^{th}$ row in a first display area, according to some embodiments.

FIG. 13 is a plan view illustrating gate lines arranged in a $(k)^{th}$ row, a $(k+1)^{th}$ row, and a $(k+2)^{th}$ row in the first display area DA1, according to some embodiments.

A first gate line electrically connected to first sub-pixel circuits arranged in the $(k)^{th}$ row in the first direction (e.g., x direction) may include a first scan line SL1, a second scan line SL2, a previous scan line SLp, a next scan line SLn, and an emission control line EL.

The first scan line SL1, the second scan line SL2, the previous scan line SLp, the next scan line SLn, and the emission control line EL passing through the $(k)^{th}$ row may be electrically connected to and overlap sub-pixel circuits arranged in the third display area DA3, for example, the third sub-pixel circuits PC3 of the sub-pixel circuit group PGD3.

A third gate line electrically connected to first sub-pixel circuits arranged in the $(k+2)^{th}$ row in the first direction (e.g., x direction) may include a first scan line SL1, a second scan line SL2, a previous scan line SLp, a next scan line SLn, and an emission control line EL.

The first scan line SL1, the second scan line SL2, the previous scan line SLp, the next scan line SLn, and the emission control line EL passing through the $(k+2)^{th}$ row may be electrically connected to and overlap sub-pixel circuits arranged in the third display area DA3, for example, the third sub-pixel circuits PC3 of the sub-pixel circuit groups PGD4 and PGE4.

A second gate line electrically connected to the first sub-pixel circuits PC1 arranged in the $(k+1)^{th}$ row in the first direction (e.g., x direction) may include a first scan line SL1, a second scan line SL2, a previous scan line SLp, a next scan line SLn, and an emission control line EL.

The first scan line SL1, the second scan line SL2, the previous scan line SLp, the next scan line SLn, and the emission control line EL passing through the $(k+1)^{th}$ pass through the third display area DA3 but are not electrically connected to sub-pixel circuits located in the third display area DA3.

The first scan line SL1, the second scan line SL2, the previous scan line SLp, the next scan line SLn, and the emission control line EL passing through the $(k+1)^{th}$ row may pass between two sub-pixel circuits adjacent to each other in the second direction (e.g., y direction) in the third display area DA3. For example, as shown in FIG. 13, two sub-pixel circuit groups PGD3 and PGD4 may be spaced apart from each other with a gap gd therebetween. The first scan line SL1, the second scan line SL2, the previous scan line SLp, the next scan line SLn, and the emission control line EL passing through the $(k+1)^{th}$ row may extend to pass through a portion corresponding to the gap gd and may be bent along the outside of the second display area DA2.

Figure 14:
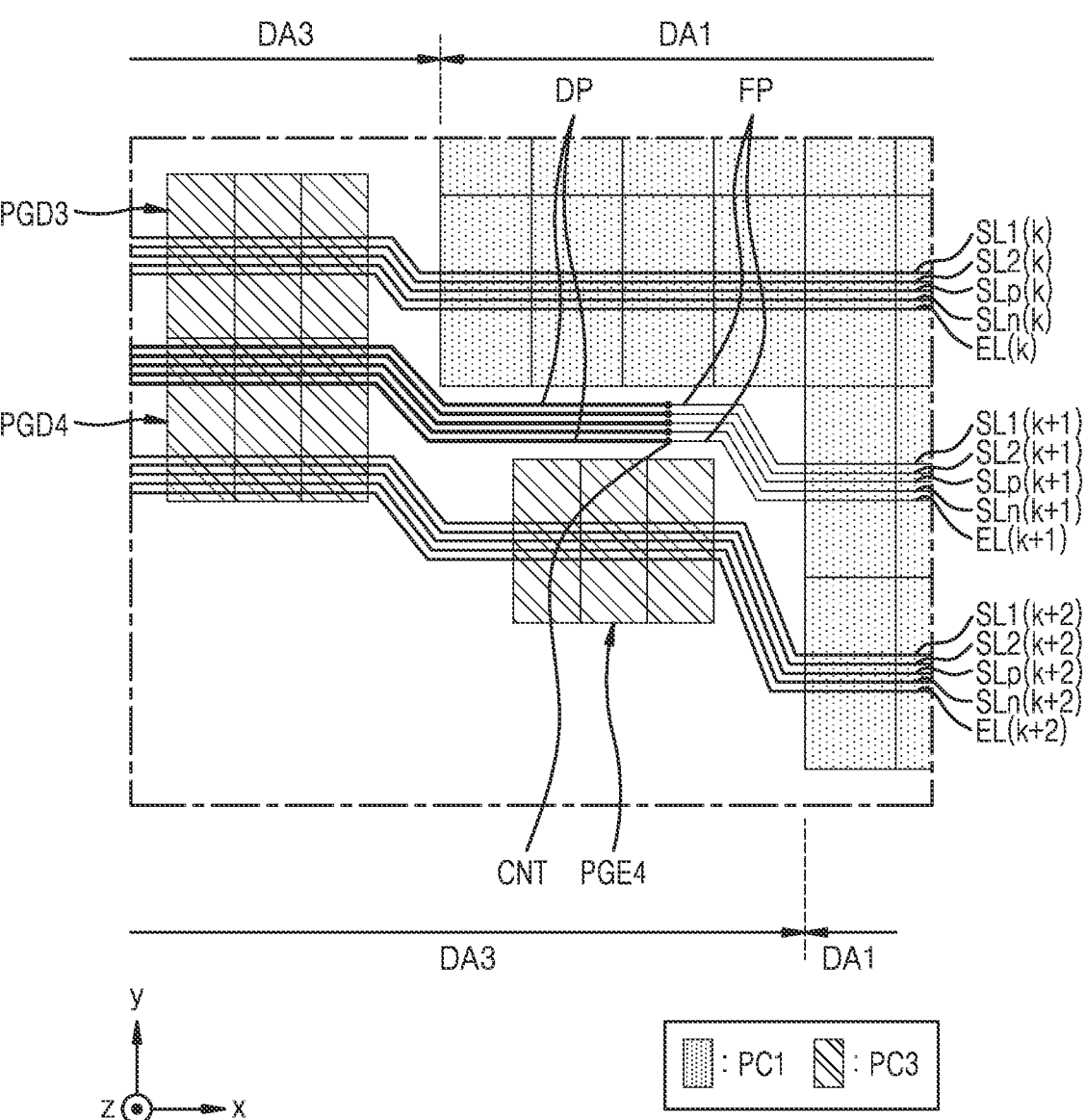
FIG. 14 is a plan view illustrating gate lines arranged in a $(k)^{th}$ row, a $(k+1)^{th}$ row, and a $(k+2)^{th}$ row in a first display area, according to some embodiments.

FIG. 14 is a plan view illustrating gate lines arranged in a $(k)^{th}$ row, a $(k+1)^{th}$ row, and a $(k+2)^{th}$ row in the first display area DA1, according to some embodiments.

First sub-pixel circuits SL1, second scan lines SL2, previous scan line SLp, next scan lines SLn, and emission control lines EL electrically connected to the first sub-pixel circuits PC1 arranged in the $(k)^{th}$ row and the $(k+1)$ row of FIG. 14 are the same as those described with reference to FIG. 13.

A structure of a second gate line electrically connected to the first sub-pixel circuits PC1 arranged in the $(k+1)^{th}$ row of FIG. 14 is different from a structure of the second gate line described with reference to FIG. 13. Sub-pixel circuits arranged in the third display area DA3 may not be spaced apart from each other in the second direction (e.g., y direction). In other words, sub-pixel circuit groups of the third display area DA3 may be spaced apart from each other in the first direction, but may not be spaced apart from each other in the second direction (e.g., y direction).

The second gate line electrically connected to the first sub-pixel circuits PC1 of the $(k+1)^{th}$ row, for example, a first scan line SL1, a second scan line SL2, a previous scan line SLp, a next scan line SLn, and an emission control line EL, may overlap sub-pixel circuits of the third display area DA3 without being electrically connected to the sub-pixel circuits of the third display area DA3. In this regard, FIG. 14 shows that the first scan line SL1, the second scan line SL2, the previous scan line SLp, the next scan line SLn, and the emission control line EL electrically connected to the first sub-pixel circuits PC1 arranged in the $(k+1)^{th}$ row overlap the third sub-pixel circuits PC3 of the sub-pixel circuit PGD4.

Each of the first scan line SL1, the second scan line SL2, the previous scan line SLp, the next scan line SLn, and the emission control line EL electrically connected to the first sub-pixel circuits PC1 of the $(k+1)^{th}$ row may include a portion (hereinafter, referred to as a first portion FP) overlapping the first sub-pixel circuits PC1 in the first display area DA1, and a portion (hereinafter, referred to as a bypassing portion DP) bypassing the second display area DA2 in the third display area DA3, and the first portion FP and the bypassing portion DP may be located on different layers.

At least one insulating layer may be located between the first portion FP and the bypassing portion DP of each of the first scan line SL1, the second scan line SL2, the previous scan line SLp, the next scan line SLn, and the emission control line EL of the $(k+1)^{th}$ row, and the first portion FP and the bypassing portion DP may be connected to each other through a contact hole CNT defined by the at least one insulating layer.

Because the bypassing portions DP of the first scan line SL1, the second scan line SL2, the previous scan line SLp, the next scan line SLn, and the emission control line EL of the $(k+1)^{th}$ row overlap the same sub-pixel circuits as the first scan line SL1, the second scan line SL2, the previous scan line SLp, the next scan line SLn, and the emission control line EL of the $(k+2)^{th}$ row in the third display area DA3 but they are located on different layers, they may not affect each other.

In the structure as shown in FIG. 14, the area occupied by sub-pixel circuits in the third display area DA3 may be relatively reduced, and interference between signal lines overlapping the same sub-pixel circuit may be minimized.

Figure 15:
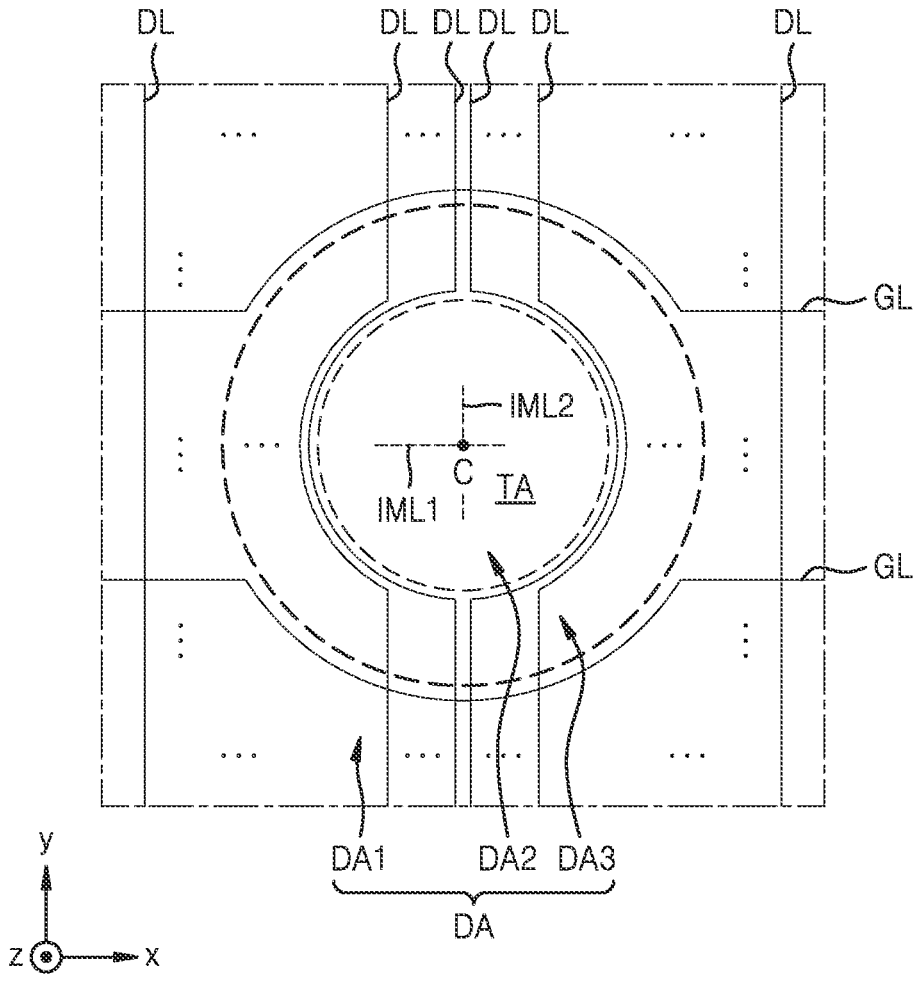
FIG. 15 is a plan view illustrating a part of a display panel, according to some embodiments.

FIG. 15 is a plan view illustrating a part of a display panel, according to some embodiments. For convenience of explanation, FIG. 15 shows signal lines passing through the display area DA, for example, the data lines DL and the gate lines GL, passing through the display area DA.

The data lines DL of FIG. 15 may have the same structure as described with reference to FIG. 8. Referring to FIG. 15, the gate lines GL may bypass the second display area DA2 in the outside (outer area) of the second display area DA2, and bypassing portions of the gate lines GL may pass through the first display area DA1.

The data lines DL may bypass the second display area DA2 in the third display area DA3 outside the second display area DA2. The data line DL located on the left and the data line DL located on the right with respect to a second virtual line IML2 passing through the center C of the second display area DA2 may be symmetrical to each other.

The gate lines GL may bypass the second display area DA2 in the first display area DA1 outside the second display area DA2. The gate line GL located above and the gate line GL located below a first virtual line IML1 passing through the center C of the second display area DA2 may be symmetrical to each other. Because the data lines DL and the gate lines GL do not pass through the second display area DA2, the display panel may include the transmissive area TA having a sufficient area.

Figure 16:
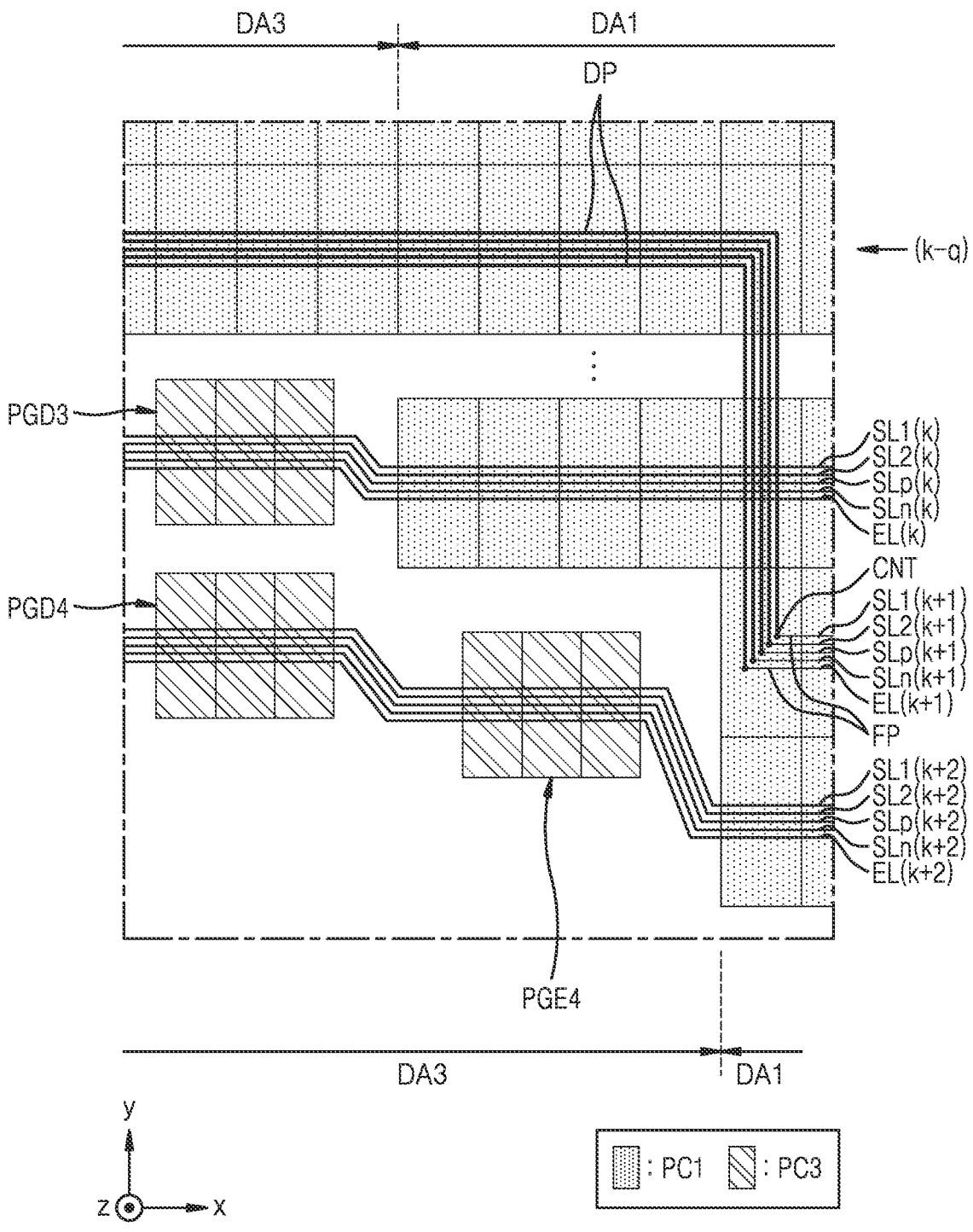
FIG. 16 is a plan view illustrating gate lines arranged in a $(k)^{th}$ row, a $(k+1)^{th}$ row, and a $(k+2)^{th}$ row in a first display area, according to some embodiments.

FIG. 16 is a plan view illustrating gate lines arranged in a $(k)^{th}$ row, a $(k+1)^{th}$ row, and a $(k+2)^{th}$ row in the first display area DA1, according to some embodiments.

First scan lines SL1, second scan lines SL2, previous scan lines SLp, next scan lines SLp, and emission control lines EL respectively and electrically connected to the first subpixel circuits PC1 arranged in the $(k)^{th}$ row and the $(k+2)^{th}$ row of FIG. 16 are the same as those described with reference to FIG. 13.

A structure of a second gate line electrically connected to the first sub-pixel circuits PC1 arranged in the $(k+1)^{th}$ row of FIG. 16 is different from a structure of the second gate line described with reference to FIG. 13 or 14. The second gate line electrically connected to the first sub-pixel circuits PC1 of the $(k+1)^{th}$ row, for example, a first scan line SL1, a second scan line SL2, a previous scan line SLp, a next scan line SLn, and an emission control line EL may overlap sub-pixel circuits of the first display area DA1 without being electrically connected to sub-pixel circuits of the third display area DA3. In this regard, FIG. 16 shows that the first scan line SL1, the second scan line SL2, the previous scan line SLp, the next scan line SLn, and the emission control line EL electrically connected to the first sub-pixel circuits PC1 arranged in the $(k+1)^{th}$ row overlap the first sub-pixel circuits PC1 arranged in a different row (e.g., $(k-q)^{th}$ row, q is a natural number).

Each of the first scan line SL1, the second scan line SL2, the previous scan line SLp, the next scan line SLn, and the emission control line EL electrically connected to the first sub-pixel circuits PC1 of the $(k+1)^{th}$ row may include the first portion FP overlapping the first sub-pixel circuits PC1 of the $(k+1)^{th}$ row in the first display area DA1 and the bypassing portion DP overlapping the first sub-pixel circuits PC1 arranged in the different row (e.g., $(k-q)^{th}$ row) in the first display area DA1, and the first portion FP and the bypassing portion DP may be located on different layers.

At least one insulating layer may be located between the first portion FP and the bypassing portion DP of each of the first scan line SL1, the second scan line SL2, the previous scan line SLp, the next scan line SLn, and the emission control line EL of the $(k+1)^{th}$ row, and the first portion FP and the bypassing portion DP may be connected to each other through a contact hole CNT defined by the at least one insulating layer.

The bypassing portions DP of the first scan line SL1, the second scan line SL2, the previous scan line SLp, the next scan line SLn, and the emission control line EL electrically connected to the first sub-pixel circuits PC1 of the $(k+1)^{th}$ row overlap the first sub-pixel circuits PC1 arranged in the different row (e.g., $(k-q)^{th}$ row, q is a natural number), but are not electrically connected to the first sub-pixel circuits PC1 arranged in the different row (e.g., $(k-q)^{th}$ row, q is a natural number).

According to some embodiments, a high-quality display panel in which a sufficient transmittance of a second display area including a transmissive area may be ensured and image quality may be uniformly maintained regardless of a position of the second display area in a display area, and an electronic device including the high-quality display panel may be provided. However, this effect is an example, and the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display panel comprising:
a plurality of light-emitting diodes in a first display area, a second display area, and a third display area, wherein the second display area is inside the first display area and comprises a transmissive area, and the third display area is between the first display area and the second display area;
a plurality of first sub-pixel circuits in the first display area, and respectively and electrically connected to first light-emitting diodes in the first display area from among the plurality of light-emitting diodes; and
a plurality of sub-pixel circuits in the third display area, wherein
the sub-pixel circuits comprise: a plurality of second sub-pixel circuits electrically connected to a plurality of second light-emitting diodes in the second display area from among the plurality of light-emitting diodes; and
a plurality of third sub-pixel circuits electrically connected to a plurality of third light-emitting diodes in the third display area from among the plurality of light-emitting diodes,
wherein first sub-pixel circuits arranged in a $(k)^{th}$ row (k is a natural number) in a first direction are electrically connected to a first gate line, first sub-pixel circuits arranged in a $(k+1)^{th}$ row in the first direction are electrically connected to a second gate line, and first sub-pixel circuits arranged in a $(k+2)^{th}$ row in the first direction are electrically connected to a third gate line,
wherein the first gate line and the third gate line are respectively and electrically connected to two sub-pixel circuits adjacent to each other in a second direction intersecting the first direction in the third display area, and
the second gate line is not electrically connected to the sub-pixel circuits in the third display area, and bypasses the second display area in an outside of the second display area.

2. The display panel of claim 1, wherein the two sub-pixel circuits adjacent to each other in the second direction in the third display area are spaced apart from each other with a gap therebetween,
wherein a bypassing portion of the second gate line passes through a portion corresponding to the gap in the third display area.

3. The display panel of claim 1, wherein the second gate line comprises a first portion overlapping the first sub-pixel circuits in the $(k+1)^{th}$ row and a bypassing portion bypassing the second display area in the outside of the second display area,
wherein the first portion and the bypassing portion of the second gate line are connected to each other through a contact hole defined by at least one insulating layer located between the bypassing portion and the first portion.

4. The display panel of claim 3, wherein the bypassing portion of the second gate line overlaps any one of the two sub-pixel circuits adjacent to each other in the second direction in the third display area.

5. The display panel of claim 3, wherein the bypassing portion of the second gate line overlaps a first sub-pixel circuit in a different row in the first display area.

6. The display panel of claim 1, wherein a data line electrically connected to at least one first sub-pixel circuit from among the plurality of first sub-pixel circuits is electrically connected to the two sub-pixel circuits adjacent to each other in the second direction in the third display area, and is bent to partially surround the second display area.

7. The display panel of claim 1, wherein each of the plurality of second sub-pixel circuits is electrically connected to two second light-emitting diodes emitting light of a same color.

8. The display panel of claim 1, wherein each of the plurality of third sub-pixel circuits is electrically connected to two third light-emitting diodes emitting light of a same color.

9. The display panel of claim 1, wherein each of the plurality of first sub-pixel circuits is electrically connected to one first light-emitting diode.

10. The display panel of claim 1, wherein the first display area, the second display area, and the third display area correspond to an image surface of the display panel,
wherein a center of the second display area is spaced apart from a virtual line passing through a center of the image surface in the second direction in a plan view.

11. An electronic device comprising:
a display panel comprising a plurality of light-emitting diodes in a display area; and
a component under the display panel,
wherein the display area comprises a first display area, a second display area inside the first display area, and a third display area between the first display area and the second display area,
wherein the display panel further comprises:
a plurality of first sub-pixel circuits in the first display area, and respectively and electrically connected to first light-emitting diodes in the first display area from among the plurality of light-emitting diodes; and
sub-pixel circuits located in the third display area, wherein the sub-pixel circuits comprise:
a plurality of second sub-pixel circuits electrically connected to a plurality of second light-emitting diodes in the second display area from among the plurality of light-emitting diodes; and
a plurality of third sub-pixel circuits electrically connected to a plurality of third light-emitting diodes in the third display area from among the plurality of light-emitting diodes,
wherein first sub-pixel circuits arranged in a $(k)^{th}$ row (k is a natural number) in a first direction are electrically connected to a first gate line, first sub-pixel circuits arranged in a $(k+1)^{th}$ row in the first direction are electrically connected to a second gate line, and first sub-pixel circuits arranged in a $(k+2)^{th}$ row in the first direction are electrically connected to a third gate line,
wherein the first gate line and the third gate line are respectively and electrically connected to two sub-pixel circuits adjacent to each other in a second direction intersecting the first direction in the third display area, and
the second gate line is not electrically connected to the sub-pixel circuits located in the third display area, and bypasses the second display area in an outside of the second display area.

12. The electronic device of claim 11, wherein the component comprises a sensor or a camera.

13. The electronic device of claim 11, wherein the two sub-pixel circuits adjacent to each other in the second direction in the third display area are spaced apart from each other with a gap therebetween,
wherein a bypassing portion of the second gate line passes through a portion corresponding to the gap in the third display area.

14. The electronic device of claim 11, wherein the second gate line comprises a first portion overlapping the first sub-pixel circuits arranged in the $(k+1)^{th}$ row and a bypassing portion bypassing the second display area in the outside of the second display area, wherein the first portion and the bypassing portion of the second gate line are connected to each other through a contact hole defined by at least one insulating layer located between the bypassing portion and the first portion.

15. The electronic device of claim 14, wherein the bypassing portion of the second gate line overlaps any one of the two sub-pixel circuits adjacent to each other in the second direction in the third display area.

16. The electronic device of claim 14, wherein the bypassing portion of the second gate line overlaps a first sub-pixel circuit arranged in a different row in the first display area.

17. The electronic device of claim 11, wherein the display panel further comprises a data line electrically connected to at least one first sub-pixel circuit from among the plurality of first sub-pixel circuits,

36 wherein the data line is electrically connected to the two sub-pixel circuits adjacent to each other in the second direction in the third display area, and is bent to partially surround the second display area.

18. The electronic device of claim 11, wherein each of the plurality of second sub-pixel circuits is electrically connected to two second light-emitting diodes emitting light of a same color.

19. The electronic device of claim 11, wherein each of the plurality of third sub-pixel circuits is electrically connected to two third light-emitting diodes emitting light of a same color.

20. The electronic device of claim 11, wherein the first display area, the second display area, and the third display area correspond to an image surface of the display panel, wherein a center of the second display area is spaced apart from a virtual line passing through a center of the image surface in the second direction in a plan view.

\* \* \* \* \*